United States Patent
Tomita

(10) Patent No.: US 7,646,660 B2
(45) Date of Patent: Jan. 12, 2010

(54) SEMICONDUCTOR MEMORY, SYSTEM, AND OPERATING METHOD OF SEMICONDUCTOR MEMORY

(75) Inventor: Hiroyoshi Tomita, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 134 days.

(21) Appl. No.: 12/035,248

(22) Filed: Feb. 21, 2008

(65) Prior Publication Data

US 2008/0239854 A1 Oct. 2, 2008

(30) Foreign Application Priority Data

Mar. 28, 2007 (JP) ............................. 2007-083484

(51) Int. Cl.
*G11C 7/00* (2006.01)
(52) U.S. Cl. .................... 365/222; 365/233.1; 365/236
(58) Field of Classification Search ................ 365/222, 365/233.1, 236
See application file for complete search history.

(56) References Cited

U.S. PATENT DOCUMENTS

| 2003/0056067 | A1 | 3/2003 | Lawrence |
| 2006/0007770 | A1* | 1/2006 | Shinozaki et al. ........... 365/222 |

FOREIGN PATENT DOCUMENTS

JP          2003-068075 A       3/2003

* cited by examiner

*Primary Examiner*—Hoai V Ho
(74) *Attorney, Agent, or Firm*—Arent Fox LLP

(57) ABSTRACT

Partial refresh information indicating enabling/disabling of a refresh operation is set according to an external input and is output as a partial set signal. A refresh request signal is output periodically corresponding to a memory block for which a refresh operation is enabled. The partial set signal is masked so as to enable a refresh operation for all of the memory blocks during a period in which the partial refresh information is changed by the external input. Thus, it is possible to prevent disabling of a refresh operation in response to a refresh request even when timing of changing the partial refresh information and timing of occurrence of the refresh request signal overlap. Consequently, the refresh operation can be executed securely, and malfunctioning of the semiconductor memory can be prevented.

24 Claims, 19 Drawing Sheets

| MRS { PSET0 PSET1 | L L | H L | L H | H H |
|---|---|---|---|---|
| | ALL | 1/2 | 1/4 | NONE |
| | BLK0 BLK1 BLK2 BLK3 (PREFA) | BLK0 BLK1 BLK2 BLK3 | BLK0 BLK1 BLK2 BLK3 | BLK0 BLK1 BLK2 BLK3 |
| IRAD5 IRAD4 | L L | L L | H L | H H |

Fig. 4

SEMICONDUCTOR MEMORY, SYSTEM, AND OPERATING METHOD OF SEMICONDUCTOR MEMORY

CROSS-REFERENCE TO RELATED APPLICATION

This application is based upon and claims the benefit of priority from Japanese Patent Application No. 2007-083484, filed on Mar. 28, 2007, the entire contents of which are incorporated herein by reference.

BACKGROUND

1. Field

The present embodiments relate to a semiconductor memory having dynamic memory cells and to a system.

2. Description of the Related Art

Recently, portable equipment such as mobile phones which operate using a battery are gaining popularity. A semiconductor memory mounted in such portable equipment is required to consume low power so that the battery can be used for long time. Further, in recent portable equipment, a large amount of data of images, music files or the like is often handled. Replacing of work memories for these portable equipment are in progress from SRAMs having a small storage capacity and a high cost per bit to DRAMs having a large storage capacity and a low cost per bit. Along with this, DRAMs that consume low power are demanded for portable equipment.

For reducing the power consumption, DRAMs having a partial self-refresh mode are developed (for example, see Japanese Unexamined Patent Application Publication No. 2003-68075). A DRAM of this type has a function to change the size of a partial refresh area for which a refresh operation is executed during the self refresh mode. Further, in portable equipment having various functions, the volume of retained data is different for each operating function.

The DRAMs having a self refresh mode and pseudo SRAMs which internally execute a refresh operation automatically have an oscillator which generates a refresh request periodically. For example, the partial refresh area is set by rewriting bit values in a mode register by a setting command. The refresh request occurs asynchronously with supply timing of the setting command. Accordingly, when timing of changing the partial refresh area by the setting command and the timing of occurrence of the refresh request overlap, there is a fear that the refresh operation is not executed in the area where the refresh operation should be operated. Thus, data retained in the memory cells disappear. In other words, the semiconductor memory malfunctions.

SUMMARY

A refresh set circuit sets partial refresh information indicating enabling/disabling of a refresh operation for each of the memory blocks according to an external input, and outputs the set partial refresh information as a partial set signal. A refresh request generation circuit outputs periodically a refresh request signal corresponding to a memory block for which enabling is indicated by the partial set signal. A refresh address counter generates in response to the refresh request signal a refresh address signal indicating a memory cell for which a refresh operation is executed. An operation control circuit executes a refresh operation for one of the memory blocks in response to the refresh request signal. A filter circuit masks the partial set signal from the refresh set circuit and outputs a partial set signal indicating enabling of a refresh operation for all of the memory blocks to the refresh request generation circuit during a period in which the partial refresh information is changed by the external input.

BRIEF DESCRIPTION OF THE DRAWINGS

FIG. 4 illustrates a partial refresh area of the first embodiment.

DETAILED DESCRIPTION OF THE EMBODIMENTS

Figure 1:
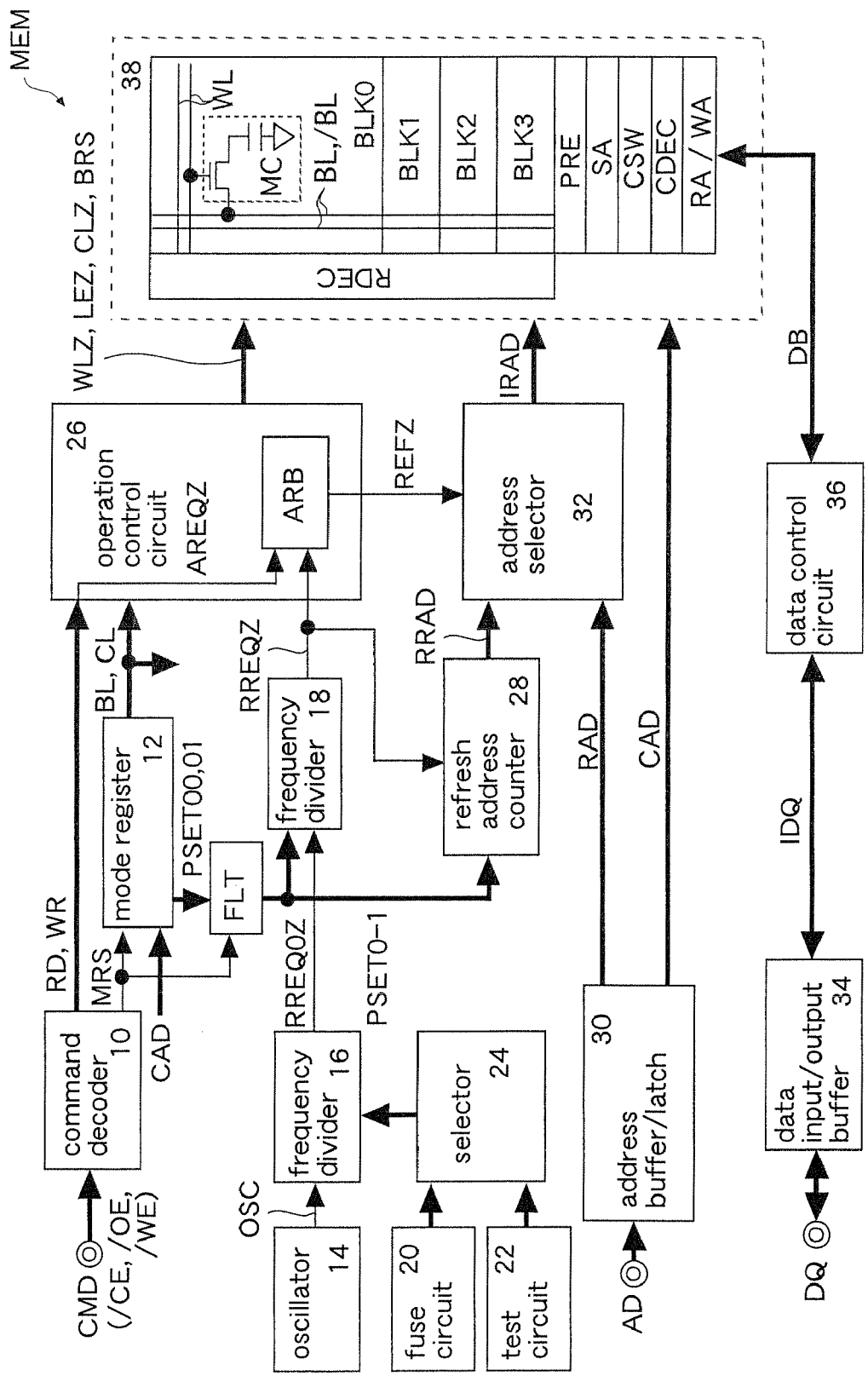
FIG. 1 illustrates a semiconductor memory of a first embodiment.

Hereinafter, embodiments will be described, using the drawings. In the drawings, each signal line shown by the heavy line is constituted of a plurality of lines. Part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 illustrates a semiconductor memory MEM of a first embodiment. The semiconductor memory MEM is, for example, an FCRAM (Fast Cycle RAM) of pseudo SRAM type. The pseudo SRAM has memory cells of DRAM and an interface of SRAM, and executes a refresh operation automatically inside the chip. The semiconductor memory MEM operates in synchronization with, for example, a clock signal CLK. Note that the present invention is applicable to either of a semiconductor memory of clock asynchronous type and a semiconductor memory of clock synchronous type.

Figure 2:
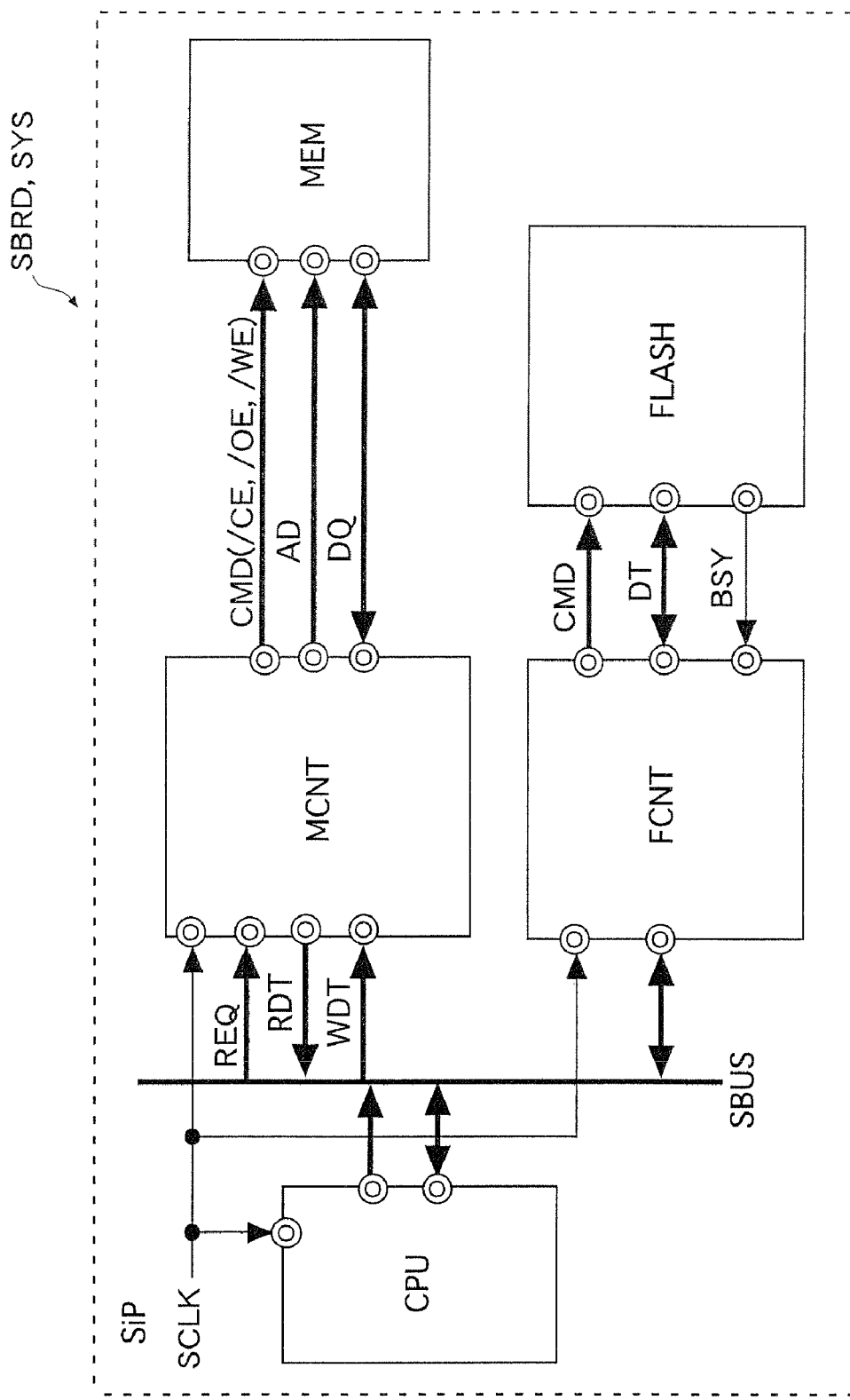
FIG. 2 illustrates a system of the first embodiment.

The memory MEM has a command decoder 10, a mode register 12, a filter circuit FLT, an oscillator 14, frequency dividers 16, 18, a fuse circuit 20, a test circuit 22, a selector 24, an operation control circuit 26 having an arbiter ARB, a refresh address counter 28, an address buffer/latch 30, an address selector 32, a data input/output buffer 34, a data control circuit 36 and a memory core 38 including memory blocks BLK (BLK0-3). In addition, the memory MEM forms a memory system SYS together with a CPU as shown in FIG. 2.

The command decoder 10 receives a command signal CMD for executing an access operation of the memory core 38, and outputs a command recognized according to the logic level of the command signal CMD as a read command signal RD, a write command signal WR or a mode register set signal MRS. The read command signal RD and the write command signal WR are an external access request AREQZ for executing an access operation to the memory core 38. For example, the command signal CMD is formed by a chip enable signal /CE, an output enable signal /OE, and a write enable signal /WE.

The mode register 12 is set according to the bit value of an address signal CAD (external input signal) supplied together with the mode register set signal MRS (mode register set command). A partial refresh area PREFA is set by the mode register 12. Further, the mode register 12 may set an operating specification of the memory MEM such as burst length BL and data latency CL. The partial refresh area PREFA is a memory block BLK for which a refresh operation is executed, and is indicated by partial set signals PSET00, PSET01. The partial refresh area PREFA is explained with FIG. 4. The burst length BL is the number of data inputs received by a data terminal DQ in response to one write command WR, and is the number of data outputs output from the data terminal DQ in response to one read command RD. The data latency CL is the number of cycles from reception of the read command RD to output of first read data DQ.

The filter circuit FLT outputs the partial set signals PSET00,01 set in the mode register 12 as the partial set signals PSET0-1. However, while partial refresh information in the latches LT is changed by the mode register set command MRS (external input), the filter circuit FLT masks the partial set signals PSET00,01 from the mode register 12 (latches LT shown in FIG. 3), and sets the values of the partial set signals PSET0-1 to values indicating enabling of a refresh operation for all the memory blocks BLK0-3.

The oscillator 14 outputs an oscillating signal OSC at a predetermined cycle (1 μs for example). The frequency divider 16 (refresh generation circuit) divides the frequency of the oscillating signal OSC and generates a reference refresh request signal RREQ0Z (10 μs for example) periodically. The frequency of the reference refresh request signal RREQ0Z can be changed according to an adjustment signal from the selector 24. The frequency divider 18 divides the frequency of the refresh request signal RREQ0Z according to the partial set signals PSET0-1 and generates a refresh request signal RREQZ periodically. The oscillator 14 and the frequency dividers 16, 18 operate as a refresh request generation circuit which periodically outputs the refresh request signal RREQZ corresponding to the memory block BLK for which enabling is indicated by the partial set signals PSET0-1.

The fuse circuit 20 has a fuse programmed for trimming the frequency of the refresh request signal RREQ0Z. The trimming is implemented in a test process after electric characteristics of the memory MEM are evaluated by an LSI tester or the like, so as to set the frequency of the refresh request signal RREQ0Z to the optimum. The test circuit 22 outputs a test signal for temporarily changing the dividing ratio of the frequency divider 16 regardless of the program state of the fuse circuit 20. The test circuit 22 operates while the memory MEM is set to the test mode by the mode register 12 or the like, and retains the value of the address signal CAD supplied together with a test mode command.

The selector 24 selects the set value of the fuse circuit 20 when the test circuit 22 is not in use, and outputs it as an adjustment signal to the frequency divider 16. Further, the selector 24 masks the set value of the fuse circuit 20 when the test circuit 22 is in use, selects the set value set to the test circuit 22, and outputs the selected value as an adjustment signal to the frequency divider 16. For example, in the test process of the memory MEM, the value of the adjustment signal for setting the frequency of the refresh request signal RREQ0Z to the optimum is obtained using the test circuit 22, and the fuse circuit 20 is programmed according to the obtained value.

The operation control circuit 26 outputs an operation control signal (word line activation signal WLZ, sense amplifier activation signal LEZ, a column selection signal CLZ and a precharge control signal BRS) so as to cause the memory core 38 to execute a read operation or a write operation in response to the read command signal RD or the write command signal WR, or cause the memory core 38 to execute a refresh operation in response to the refresh request signal RREQZ. The read operation, the write operation and the refresh operation are executed in one of the memory blocks BLK0-3. The word line activation signal WLZ controls activation timing of a word line WL, and the sense amplifier activation signal LEZ controls activation timing of a sense amplifier SA. The column selection signal CLZ controls on/off timing of a column switch CSW, and the precharge control signal BRS controls on/off timing of the precharge circuit PRE.

When the external access request AREQZ (read command RD or write command WR) conflicts with the refresh request RREQZ, the arbiter ARB of the operation control circuit 26 decides which one of them should be given priority. For example, the arbiter ARB gives priority to the refresh request RREQZ when the external access request AREQZ (read command RD or write command WR) and the refresh request RREQZ are received simultaneously, and activates a refresh signal REFZ for a predetermined period. The read operation in response to the read command RD is suspended until the refresh operation in response to the refresh request RREQZ is completed and the refresh signal REFZ is inactivated. Conversely, when the refresh request RREQZ is supplied during a read operation, the refresh operation in response to the refresh request RREQZ is suspended until the read operation is completed. At this time, the refresh signal REFZ is activated for a predetermined period in response to the completion of the read operation. The same applies to the write command WR.

The refresh address counter 28 sequentially updates refresh address signals RRAD (RRAD0-5) indicating a memory cell MC for which a refresh operation is executed in response to the refresh request signal RREQZ. At this time, the refresh address signals RRAD are updated after an internal row address signal IRAD (refresh address) corresponding to the refresh request signal RREQZ is supplied to the memory core 38. Accordingly, it is possible to prevent change of the refresh address signals RRAD when executing a refresh operation, and malfunctioning of the memory core 38 can be prevented.

The range of the refresh address signals RRAD to be updated changes according to the partial set signals PSET0-1.

The address buffer/latch 30 receives an address signal AD via an external terminal and outputs the received address as the row address signal RAD and the column address signal CAD. The row address signal RAD is supplied for selecting a word line. The column address signal CAD is supplied for selecting a plurality of sets of bit lines BL, /BL corresponding to the data terminal DQ formed by a plurality of bits. The address selector 32 selects the refresh address signals RRAD for executing a refresh operation while the refresh signal REFZ is activated, selects the row address signal RAD for executing a read operation or write operation while the refresh signal REFZ is inactivated, and outputs the selected signal as the internal row address signal IRAD to the memory core 38.

The data input/output buffer 34 receives a write data signal via the data terminal DQ, and outputs the received data signal as an internal data signal IDQ. Further, the data input/output buffer 34 receives a read data signal from the memory cells MC, and outputs the received data signal to the data terminal DQ. During a write operation, the data control circuit 36 converts the internal data signal IDQ (write data) from serial to parallel, and outputs the converted signal to a data bus DB. During a read operation, the data control circuit 36 converts read data on the data bus DB from parallel to serial and outputs the converted data as the internal data signal IDQ to the data bus DB. For example, the bit width of the data bus DB is twice the bit width of the data terminal DQ (16 data terminals DQ and a 32-bit data bus).

The memory core 38 has four memory blocks BLK0-3, a row decoder RDEC, a precharge circuit PRE, a sense amplifier SA, a column switch CSW, a column decoder CDEC, a read amplifier RA and a write amplifier WA. Each of the memory blocks BLK0-3 has a plurality of dynamic memory cells MC, a plurality of word lines WL coupled to the memory cells MC arranged in one direction, and a plurality of bit line pairs BL, /BL coupled to the memory cells MC arranged in a direction orthogonal to the one direction. The memory cells MC each have a capacitor for retaining data as electric charge and a transfer transistor for coupling one end of the capacitor to one of the bit lines BL (or /BL). The other end of the capacitor is coupled to a precharge voltage line. The gate of the transfer transistor is coupled to one of the word lines WL. By selecting the word lines WL, one of a read operation, a write operation, and a refresh operation is executed.

In this example, the common bit line pairs BL, /BL are wired through the memory blocks BLK0-3, and the precharge circuit PRE, the sense amplifier SA, and so on are shared by the memory blocks BLK0-3. However, the precharge circuit PRE and the sense amplifier SA may be arranged for each of the memory blocks BLK0-3. Further, a part of the column decoder CDEC as well as the read amplifier RA and the write amplifier WA may be arranged commonly for the memory blocks BLK0-3.

The row address decoder RDEC decodes the internal row address signal IRAD for selecting one of the word lines WL. The precharge circuit PRE couples the bit line pairs BL, /BL to the precharge voltage line in synchronization with the precharge control signal BRS while the memory cells MC are not accessed. The sense amplifier SA amplifies a difference in signal amounts of data signals read to the bit line pairs BL, /BL. The column address decoder CDEC decodes the column address signal CAD for selecting the bit line pair BL, /BL to/from which a data signal is input/output. The column switch CSW couples the bit lines BL, /BL corresponding to the column address signal CAD to the read amplifier RA and the write amplifier WA. The read amplifier RA amplifies complementary read data output via the column switch CSW during a read access operation. The write amplifier WA amplifies complementary write data supplied via the data bus DB and supplies the amplified data to the bit line pairs BL, /BL during a write access operation.

FIG. 2 illustrates a system SYS of the first embodiment. The system SYS is, for example, portable equipment such as a mobile phone, and has a system board SBRD in which a system in package SiP (System in Package) for controlling the operation of the portable equipment is mounted. The SiP has the memory MEM shown in FIG. 1, a memory controller MCNT which accesses the memory MEM, a flash memory FLASH, a flash controller FCNT which accesses the flash memory FLASH, a CPU (system controller) controlling the entire system, and so on. The CPU, the memory controller MCNT and the flash controller FCNT are coupled to each other by a system bus SBUS, and operate in synchronization with a system clock signal SCLK. When the memory MEM or the flash memory FLASH operate in synchronization with the clock signal CLK, the system clock signal SCLK is supplied as the clock signal CLK to the memory MEM or the flash memory FLASH. The SiP may be coupled to a higher system via an external bus.

For example, in this system SYS, a program and data stored in the flash memory FLASH are transferred to the memory MEM when powered on. Thereafter, the CPU executes the program transferred to the memory MEM for realizing the function of the system SYS, and reads/writes data retained in the memory MEM. The CPU outputs an access request for accessing the memory MEM and a write data signal WDT, and receives a read data signal RDT from the memory MEM. Further, the CPU outputs an access request for accessing the flash memory FLASH. The CPU does not output a refresh request, and hence is not able to recognize the timing that the memory MEM executes a refresh operation. In other words, the memory MEM executes the refresh operation automatically without being recognized by the CPU.

Figure 3:
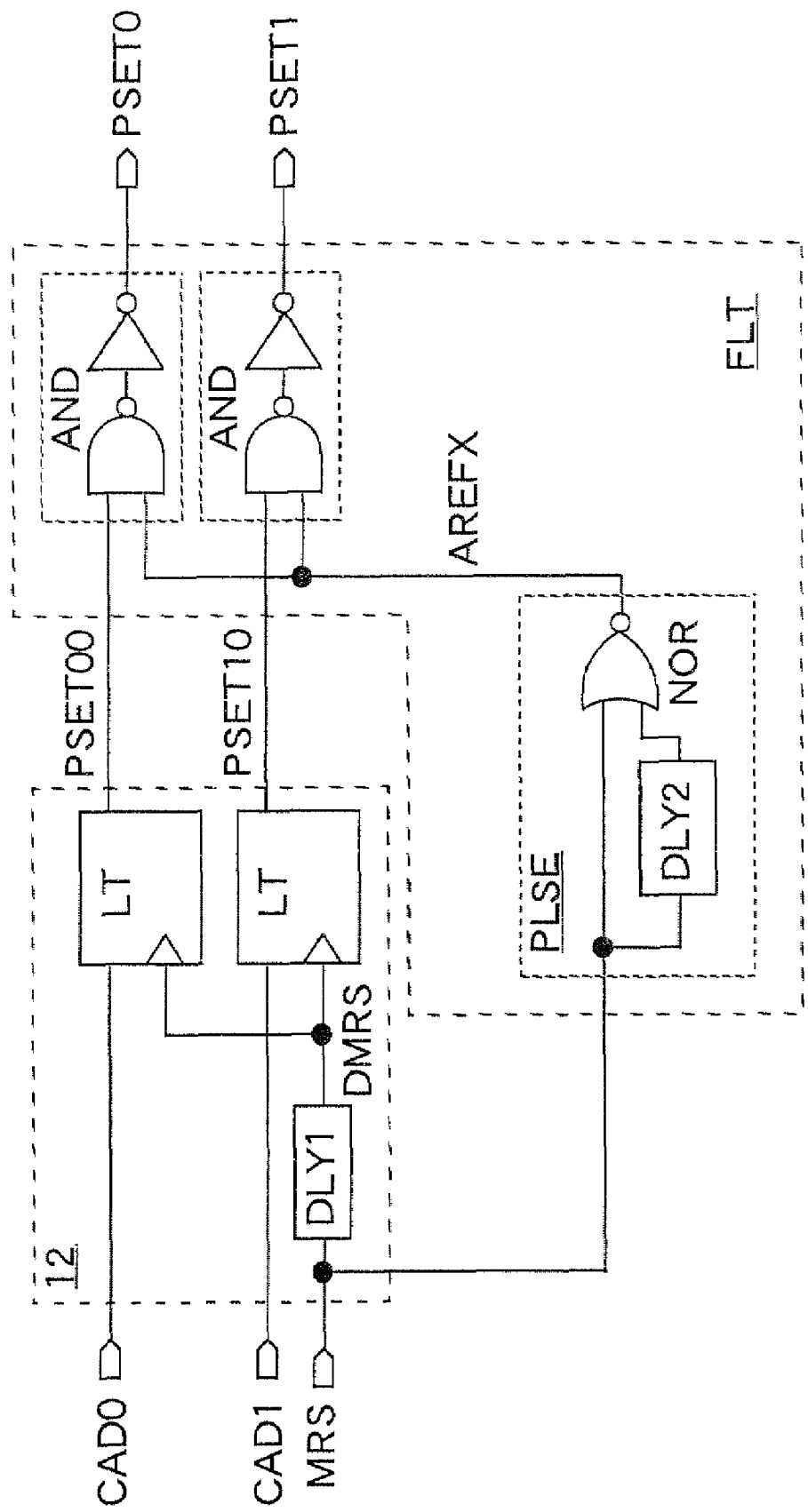
FIG. 3 illustrates details of a mode register and a filter circuit shown in FIG. 1.

FIG. 3 illustrates details of the mode register 12 and the filter circuit FLT shown in FIG. 1. Note that the mode register 12 in the diagram only illustrates a circuit for setting the partial refresh area PREFA. A circuit for setting the burst length BL and the data latency CL is omitted from the diagram. The mode register 12 has a delay circuit DLY1 and two latches LT (refresh set circuit) which receives the column address signal CAD (CAD0-1). The delay circuit DLY1 delays the mode register set signal MRS and outputs a delay set signal DMRS. The two latch circuits LT latch partial refresh information indicated by column address signals CAD0-1 (external input) in synchronization with the delay set signal DMRS, and retains the latched values as values setting the partial refresh area PREFA shown in FIG. 4. The latch circuits LT output the retained values as partial set signals PSET00, PSET10.

The filter circuit FLT has a pulse width extension circuit PLSE and two AND circuits corresponding to the latches LT respectively. The pulse width extension circuit PLSE has a delay circuit DLY2 and a NOR gate. The pulse width extension circuit PLSE extends a falling edge of the mode register set signal MRS in pulse form and outputs a signal with inverted logic as an all refresh signal AREFX. The all refresh signal AREFX is activated to a low logic level during a period in which the mode register set signal MRS is activated to a high logic level.

The two AND circuits output the partial set signals PSET00-10 as the partial set signals PSET0-1 while the all refresh signal AREFX is inactivated (high logic level). Further, the AND circuits fix the partial set signals PSET0-1 to low logic levels while the all refresh signal AREFX is activated (low logic level). Thus, the partial set signals PSET0-1 are fixed to low logic levels regardless of the values retained in the latches LT during a predetermined period in which the mode register set command MRS is supplied. Accordingly, during a set period of the latches LT of the mode register 12, all the memory blocks BLK0-3 are set to the partial refresh area PREFA.

FIG. 4 illustrates the partial refresh area PREFA of the first embodiment. The memory blocks BLK indicated by hatching are the partial refresh area PREFA for which execution of the refresh operation is enabled. For the memory blocks BLK indicated by blank spaces, the refresh operation is disabled. The larger the partial refresh area PREFA is, the larger the retainable data amount, and larger the power consumption are. Conversely, the smaller the partial refresh area PREFA is, the smaller the retainable amount, and smaller the power consumption are.

When the values of the partial set signals PSET0-1 set by the mode register set command MRS are both a low logic level L, all the memory blocks BLK are set to the partial refresh area PREFA (ALL). When the values of the partial set signals PSET0-1 are both a high logic level H, the refresh operation for all the memory blocks BLK0-3 is disabled (NONE). When the values of the partial set signals PSET0-1 are H, L, the memory blocks BLK0-1 are set to the partial refresh area PREFA (½). When the values of the partial set signals PSET0-1 are L, H, only the memory block BLK0 is set to the partial refresh area PREFA (¼).

Note that the memory blocks BLK0-3 are selected by two bits, IRAD4-5, of the row address signal IRAD. When the values of the row address signals IRAD4-5 are L, L, the memory block BLK0 is selected. Similarly, when the values of the row address signals IRAD4-5 are H, L/L, H/H, H, the memory blocks BLK1/BLK2/BLK3 are selected respectively.

Figure 5:
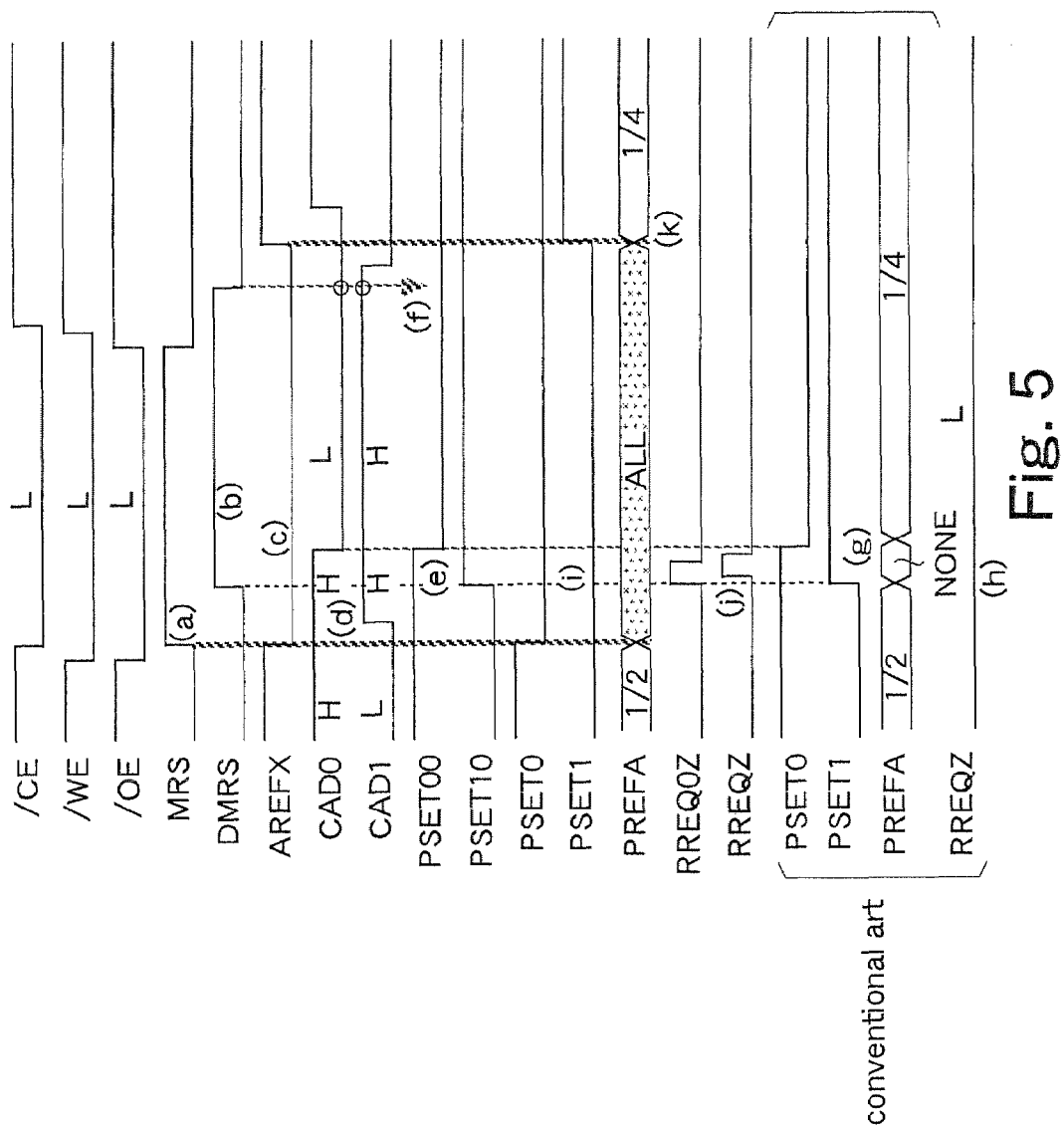
FIG. 5 illustrates operations of the mode register and the filter circuit shown in FIG. 3.

FIG. 5 illustrates operations of the mode register 12 and the filter circuit FLT shown in FIG. 3. In the example shown in FIG. 5, the partial refresh area PREFA is set to ½ in advance. Specifically, the refresh operation is executed to retain the data in the memory blocks BLK0-1. By the mode register set command MRS, the partial refresh area PREFA is changed from ½ to ¼.

The mode register set signal MRS is activated when the chip enable signal /CE, the write enable signal /WE and the output enable signal /OE are at low logic levels (FIG. 5(*a*)). In response to the mode register set signal MRS, the delay set signal DMRS and the all refresh signal AREFX are output (FIG. 5(*b*, *c*)). To set the partial refresh area PREFA to ¼, the column address signals CAD0-1 change to levels L, H. However, in this example, the column address line CAD0 has a larger load than the column address line CAD1. Accordingly, the change of the address line CAD0 from the level H to the level L is later than the change of the address line CAD1 from the level L to the level H. Consequently, in the column address signals CAD0-1, a period of levels H, H occurs (FIG. 5(*d*)). The latches LT shown in FIG. 3 output the levels of the column address signals CAD0-1 as the partial set signals PSET00,10 while the delay set signal DMRS is at a high logic level (FIG. 5(*e*)), and latch the levels of the column address signals CAD0-1 in synchronization with a falling edge of the delay set signal DMRS (FIG. 5(*f*)).

Prior to the present invention, the partial set signals PSET0-1 are output directly from the latches LT shown in FIG. 3. Accordingly, when levels of the partial set signals PSET0-1 are both a level H, the partial refresh area PREFA is set to "NONE", and the refresh operation for the memory blocks BLK0-3 is disabled temporarily (FIG. 5(*g*)). The frequency divider 18 shown in FIG. 1 masks the refresh request signal RREQ0Z received during the period of "NONE", and does not activate the refresh request signal RREQZ (FIG. 5(*h*)). As a result, the refresh operation in response to the refresh request signal RREQ0Z is not executed.

When the refresh address signal RRAD corresponding to the refresh request signal RREQ0Z indicates the memory block BLK0, the refresh operation for the memory block BLK0 is omitted once. The memory block BLK0 is a block for which the refresh operation is executed so as to retain data when the partial refresh area PREFA is changed to ¼. Therefore, in the memory cells MC for which the refresh operation is omitted, data are lost until the next refresh operation is executed.

On the other hand, in this embodiment, over the period in which the column address signals CAD0-1 are both changed to a level H, the all refresh signal AREFX is activated and the partial set signals PSET0-1 are fixed forcibly to low logic levels L regardless of the levels retained in the latches LT (FIG. 5(*i*)). Accordingly, during this period, the partial refresh area PREFA is set to "ALL" temporality. Therefore, the refresh request signal RREQZ is output in response to the refresh request signal RREQ0Z, and the refresh operation for the memory blocks BLK is executed (FIG. 5(*j*)). The partial refresh area PREFA is switched from "½" to "¼" in synchronization with a rising edge of the all refresh signal AREFX (FIG. 5(*k*)).

Figure 6:
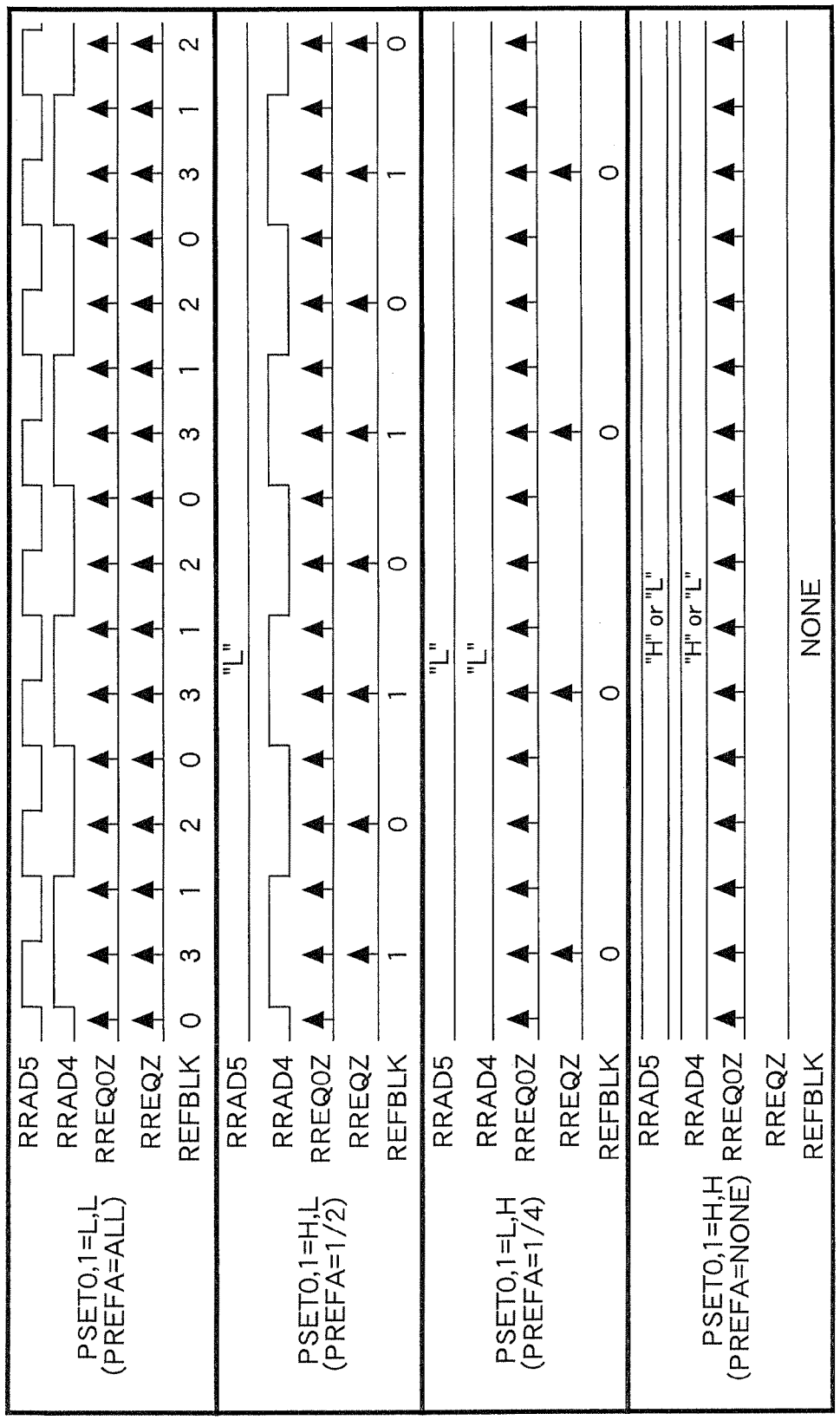
FIG. 6 illustrates an operation of the memory of the first embodiment.
Figure 9:
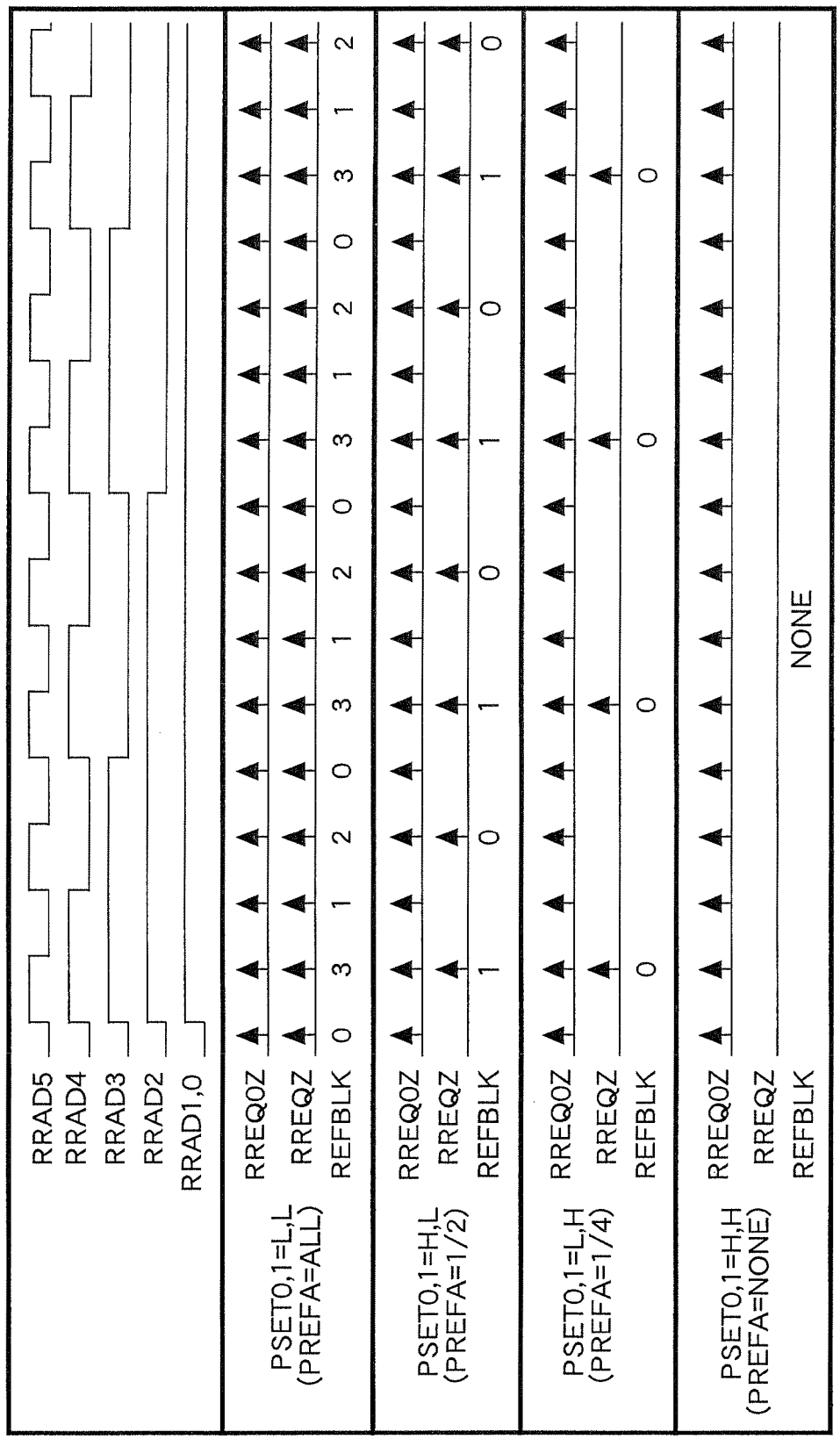
FIG. 9 illustrates an operation of the memory of the second embodiment.

FIG. 6 illustrates an operation of the memory MEM of the first embodiment. When the levels of the partial set signals PSET0-1 are L, L, the memory blocks BLK0-3 are set to the partial refresh area PREFA (ALL). In this case, the frequency divider 18 shown in FIG. 1 outputs the refresh request signal RREQZ in synchronization with the refresh request signal RREQ0Z. The refresh address counter 28 shown in FIG. 1 changes the refresh address signals RRAD5-4 sequentially in synchronization with the refresh request signal RREQZ when the partial set signals PSET0-1 are at levels L, L. Then, in synchronization with the refresh request signal RREQZ, the refresh operation for the memory blocks BLK0-3 is executed sequentially. In FIG. 6, REFBLK indicates the number of the memory block BLK for which the refresh operation is executed. In addition, the refresh address signals RRAD3-0 are output sequentially as shown in FIG. 9. Specifically, the lower order bits of the refresh address counter 28 are assigned for selection of the memory blocks BLK0-3, and the higher order bits thereof are assigned for selection of the word line WL in each of the memory blocks BLK0-3. Then, the word line WL coupled to the memory cells MC for which the refresh operation is executed is selected according to the refresh address signals RRAD3-0.

When the levels of the partial set signals PSET0-1 are H, L, the memory blocks BLK0-1 are set to the partial refresh area PREFA (½). In this case, the frequency divider 18 divides the refresh request signal RREQ0Z in two and outputs them as the refresh request signal RREQZ. The refresh address counter 28 fixes the refresh address signal RRAD5 to a low logic level L when the partial set signals PSET0-1 are at levels H, L. Accordingly, only the refresh address signal RRAD4 changes sequentially in synchronization with the refresh request signal RREQZ. Then, in synchronization with the refresh request signal RREQZ, the refresh operation for the memory blocks BLK0-1 is executed sequentially.

When the levels of the partial set signals PSET0-1 are L, H, only the memory block BLK0 is set to the partial refresh area PREFA (¼). In this case, the frequency divider 18 divides the refresh request signal RREQ0Z into four and outputs them as the refresh request signal RREQZ. The refresh address counter 28 fixes the refresh address signals RRAD4-5 to low logic levels L when the partial set signals PSET0-1 are at levels L, H. Accordingly, the refresh operation for the memory block BLK0 is executed sequentially in synchronization with the refresh request signal RREQZ.

When the levels of the partial set signals PSET0-1 are H, H, the partial refresh area PREFA is not set (NONE). In this case, the frequency divider 18 disables output of the refresh request signal RREQZ. The refresh address counter 28 holds the refresh address signals RRAD4-5 to low logic levels L or high logic levels H when the partial set signals PSET0-1 are at levels H, H. Accordingly, the refresh operation for all the memory blocks BLK0-3 is disabled. In other words, the refresh block REFBLK does not exist. Thus, the refresh address counter 28 fixes the logic of at least one bit of the refresh address signals RRAD4-5 according to the partial set signals PSET0-1.

In this embodiment, when the partial refresh area PREFA is changed, the generated refresh address signal RRAD changes according to change of the cycle of the refresh request signal RREQZ. Accordingly, the refresh cycle of each memory cell MC becomes constant without depending on the size of the partial refresh area PREFA. Therefore, data retained in the memory cells MC included in the partial refresh area PREFA will not disappear.

As above, in the first embodiment, while the mode register set command MRS is set, it is possible to prevent masking of a refresh operation even when the timing of changing the partial refresh information by the mode register 12 and the timing of occurrence of the refresh request signal RREQZ overlap. Specifically, during a period in which the levels of the address signals CAD0-1 supplied together with the mode register set command MRS are not stable due to skew or the like, and the partial refresh information is not determined, the partial refresh area PREFA is set forcibly to "ALL". Thus, it is possible to prevent disabling of a necessary refresh operation, and to prevent destruction of data retained in the memory cells MC. Consequently, malfunctioning of the memory MEM can be prevented.

The dividing ratio of the frequency divider 18 is changed according to the partial set signals PSET0-1, and the logic of at least one bit of the refresh address signal RRAD is fixed according to the partial set signals PSET0-1. Accordingly, the refresh operation for only the memory block BLK (=partial refresh area PREFA) according to the partial set signals PSET0-1 can be executed sequentially.

Figure 7:
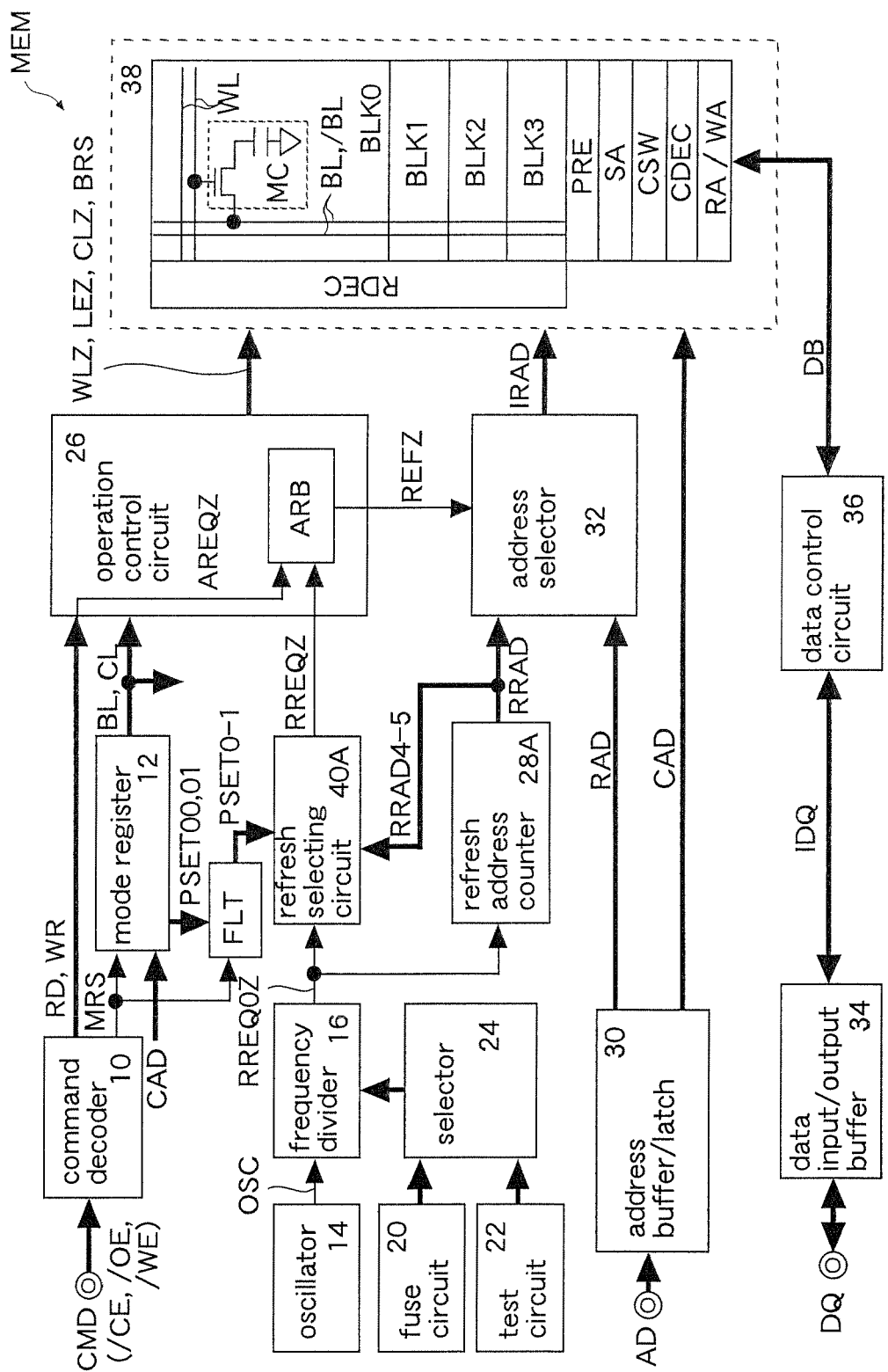
FIG. 7 illustrates a semiconductor memory of a second embodiment.

FIG. 7 illustrates a second embodiment of the present invention. The same elements as those explained in the first embodiment are given the same reference signs, and detailed explanation thereof is omitted. In this embodiment, instead of the refresh address counter 28 of the first embodiment, a refresh address counter 28A is formed. Further, the frequency divider 18 of the first embodiment is deleted, and a refresh selection circuit 40A is added instead. The other structure is the same as in the first embodiment. For example, the system SYS of this embodiment has the same structure as in FIG. 2. The partial refresh area PREFA is the same as in FIG. 4.

The refresh selection circuit 40A has a function to mask the refresh request signal RREQZ based on the values of the partial set signals PSET0-1 (partial refresh area PREFA) and the refresh address signals RRAD4-5. The refresh address counter 28A updates the refresh address signals RRAD (RRAD0-5) sequentially in synchronization with the refresh request signal RREQ0Z regardless of the values of the partial set signals PSET0-1.

Figure 8:
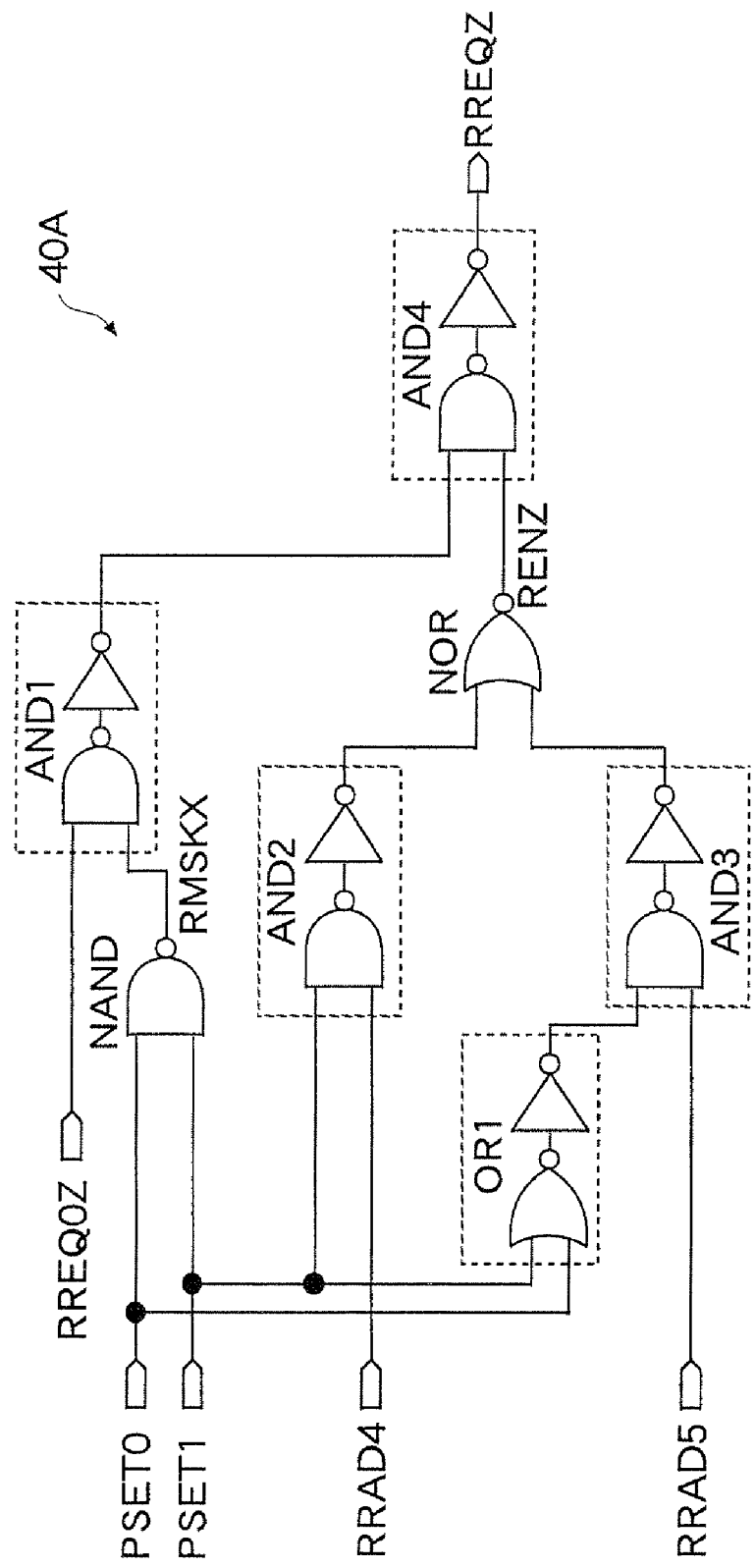
FIG. 8 illustrates details of a refresh selection circuit shown in FIG. 7.

FIG. 8 illustrates details of the refresh selection circuit 40A shown in FIG. 7. The refresh selection circuit 40A has a NAND gate, AND circuits AND1-4, an OR circuit OR1, and a NOR gate. The NAND gate activates the refresh mask signal RMSKX to a low level when the partial set signals PSET0-1 indicate "H, H (NONE)". The AND circuit AND1 masks the refresh request signal RREQ0Z while the refresh mask signal RMSKX is activated. By the NAND gate and the AND circuit AND1, the refresh operation for the memory blocks BLK with blank spaces in the state "NONE" shown in FIG. 4 is masked.

The AND circuit AND2 outputs a high logic level so as to mask the refresh request signal RREQZ when the partial set signal PSET1 indicates "H" and the refresh address signal RRAD4 is at a high logic level. Specifically, when the partial refresh area PREFA includes "¼", the refresh operation for the memory blocks BLK1,3 is disabled.

The OR circuit OR1 outputs a high logic level when the partial set signal PSET0 or PSET1 is at a high logic level, in other words, the partial refresh area PREFA is other than "ALL". The AND circuit AND3 outputs a high logic level so as to mask the refresh request signal RREQZ when the partial refresh area PREFA is set to other than "ALL", and the refresh address signal RRAD5 is at a high logic level. In other words, when the partial refresh area PREFA includes "½" or "¼", the refresh operation for the memory blocks BLK2,3 is disabled.

The NOR gate inactivates a refresh enable signal RENZ to a low logic level in response to a high logic level from the AND circuit AND2 or AND3, and activates the refresh enable signal RENZ to a high logic level in response to a low logic level from the AND circuits AND2 and AND3. The AND circuit AND4 outputs the refresh request signal RREQ0Z supplied via the AND circuit AND1 as the refresh request signal RREQZ while the refresh enable signal RENZ is activated. Further, the AND circuit AND4 masks an output of the refresh request signal RREQZ in response to the refresh request signal RREQ0Z while the refresh enable signal RENZ is inactivated. By the OR gate, the AND circuits AND2-3 and the NOR circuit, the refresh operation for the memory blocks BLK with blank spaces in the state "½" and the state "¼" shown in FIG. 4 is masked.

FIG. 9 illustrates an operation of the memory MEM of the second embodiment. In this embodiment, the refresh address counter 28A updates the refresh address signals RRAD0-5 sequentially in response to the refresh request signal RREQ0Z. The other operation is the same as in the first embodiment (FIG. 6). Similarly to the first embodiment, the refresh address signals RRAD0-5 are updated after the internal row address signal IRAD (refresh address) corresponding to the refresh request signal RREQ0Z is supplied to the memory core 38.

As above, also in the second embodiment, the same effects as in the above-described first embodiment can be obtained. Further, in this embodiment, a part of pulses of the reference refresh request signal RREQ0Z is masked according to the partial set signals PSET0-1 and the refresh address signals RRAD4-5, and the rest of the pulses which are not masked are output as the refresh request signal RREQZ. Thus, in response to the refresh request signal RREQZ, the refresh operation for only the memory block BLK (=partial refresh area PREFA) according to the partial set signals PSET0-1 can be executed sequentially.

Figure 10:
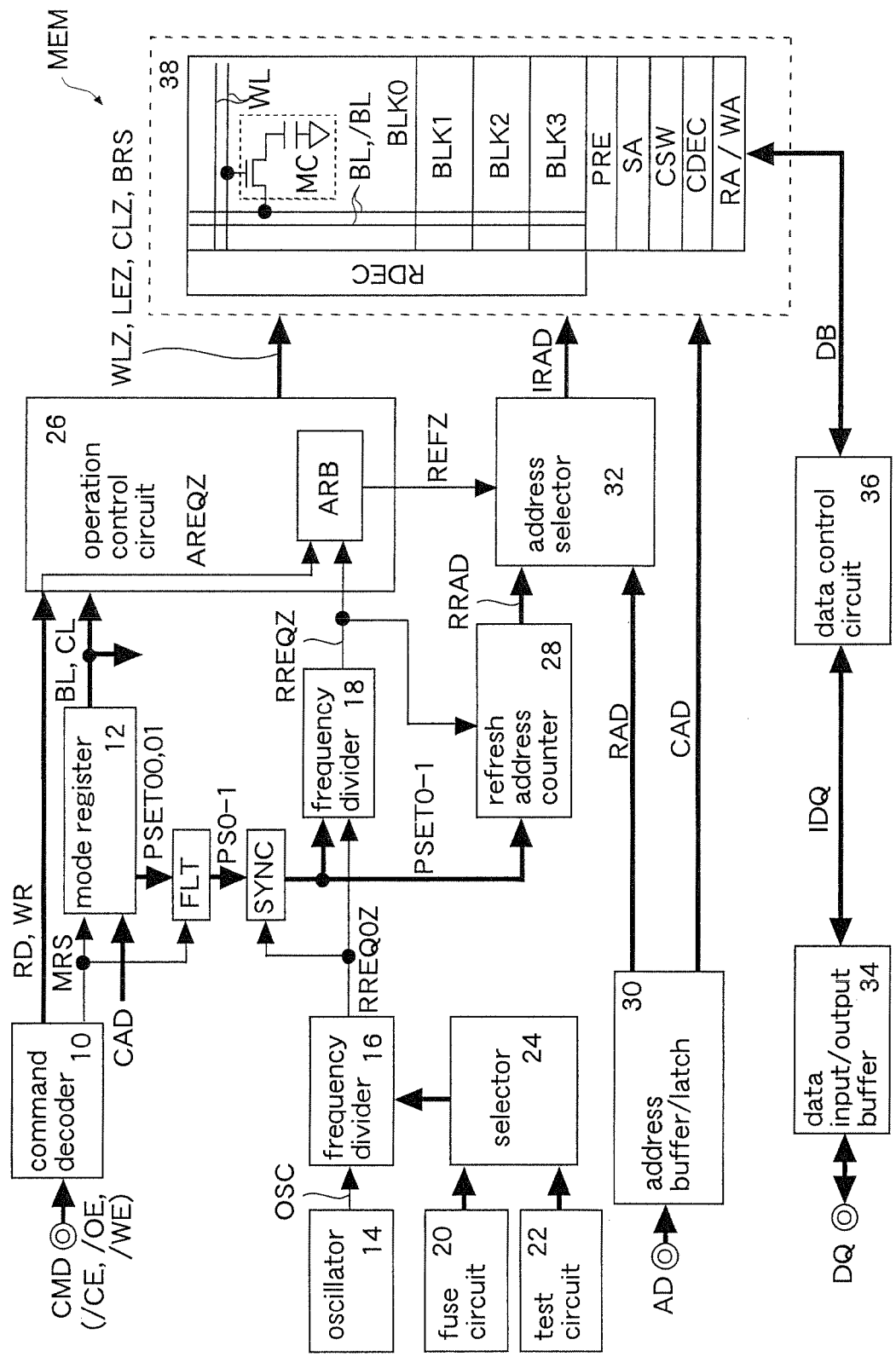
FIG. 10 illustrates a semiconductor memory of a third embodiment.

FIG. 10 illustrates a third embodiment of the present invention. The same elements as those explained in the first and second embodiments are given the same reference signs, and detailed explanation thereof is omitted. In this embodiment, a synchronous circuit SYNC is formed between the filter circuit FLT and the frequency divider 18 and the refresh address counter 28 of the first embodiment. The other structure is the same as in the first embodiment. Specifically, the semiconductor memory MEM is, for example, an FCRAM (Fast Cycle RAM) of pseudo SRAM type. For example, the system SYS of this embodiment has the same structure as in FIG. 2. The partial refresh area PREFA is the same as in FIG. 4.

Figure 11:
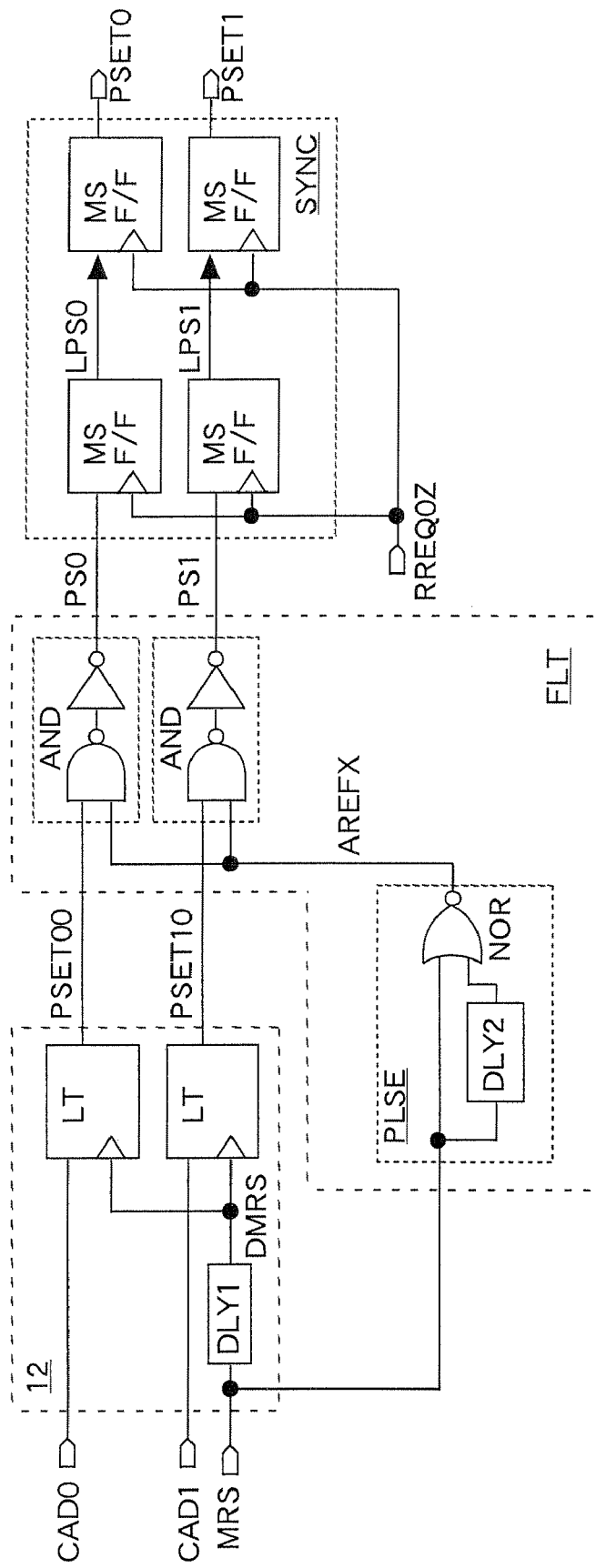
FIG. 11 illustrates details of a mode register, a filter circuit and a synchronous circuit shown in FIG. 10.

FIG. 11 illustrates details of the mode register 12, the filter circuit FLT and the synchronous circuit SYNC shown in FIG. 10. The mode register 12 and the filter circuit FLT are the same as in the first embodiment (FIG. 3).

The synchronous circuit SYNC has a pair of master-slave flip-flops MSF/F coupled in series for outputting the partial set signal PSET0, and a pair of master-slave flip-flops MSF/F coupled in series for outputting the partial set signal PSET1. Each flip-flop MSF/F receives an input signal during a period in which the refresh request signal RREQ0Z is at a high logic level, latches the value of an input signal received in synchronization with a falling edge of the refresh request signal RREQ0Z, and outputs the latched value.

The flip-flop MSF/F in the front stage latches partial set signals PS00, PS01 from the AND circuit, and outputs the latched values as partial set signals LPS0, LPS1. The flip-flop MSF/F in the rear stage latches the partial set signals LPS0, LPS1 and outputs the latched values as the partial set signals PSET0-1. Thus, the partial set signals PSET0-1 are output in synchronization with the refresh request signal RREQ0Z (=RREQZ).

Figure 12:
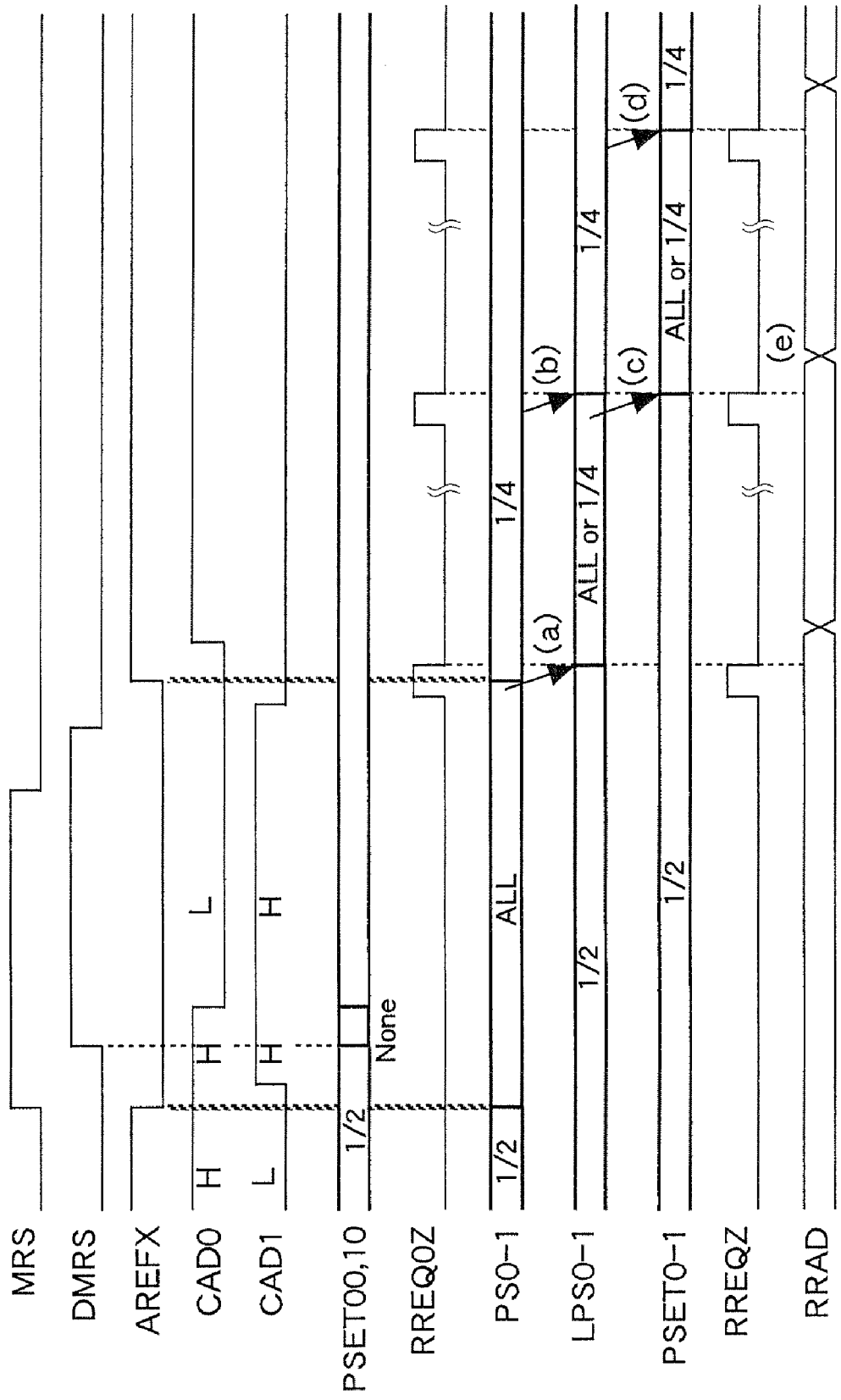
FIG. 12 illustrates operations of the mode register, the filter circuit and the synchronous circuit shown in FIG. 11.

FIG. 12 illustrates operations of the mode register 12, the filter circuit FLT and the synchronous circuit SYNC shown in FIG. 11. The waveforms up to output of the latches LT (PS0, PS1) are the same as in the first embodiment (FIG. 5). In this example, the refresh request signal RREQ0Z occurs at almost the same timing as a rising edge of the all refresh signal AREFX. Timing of supplying the mode register set command MRS to the memory MEM and the timing of occurrence of the refresh request signal RREQ0Z are asynchronous, and hence the state shown in FIG. 12 occurs at a predetermined probability.

The flip-flops MSF/F in the front stage operate at timing when the partial set signals PS0-1 change from "ALL" to "¼" in synchronization with a falling edge of the refresh request signal RREQ0Z. Thus, the flip-flops MSF/F output the partial set signals LPS0-1 indicating "ALL" or "¼" (FIG. 12(a)). In synchronization with the next falling edge of the refresh request signal RREQ0Z, the flip-flops MSF/F in the front stage output the partial set signals LPS0-1 indicating "¼" (FIG. 12(b)), and the flip-flops MSF/F in the rear stage output the partial set signals PSET0-1 indicating "ALL" or "¼" (FIG. 12(d)).

In synchronization with the next falling edge of the refresh request signal RREQ0Z, the flip-flops MSF/F in the rear stage outputs the partial set signals PSET0-1 indicating "¼" (FIG. 12(d)). Thus, the partial refresh area PREFA is set to "¼" in response to the third refresh request signal RREQ0Z from the mode register set command MRS. A period needed for occurrence of the third refresh request signal RREQ0Z is 30 μs for example. The largest cycle of the refresh operation needed for the memory cells MC to retain data is 32 ms for example. Accordingly, the delay of 30 μs of the refresh operation does not affect the memory operation.

In this manner, the partial set signals PSET0-1 are changed after output of pulses of the refresh request signals RREQ0Z, RREQZ in synchronization with the refresh request signal RREQ0Z. Accordingly, it is possible to prevent switching of the partial set signals PSET0-1 while pulses of the refresh request signal RREQZ are output, and to prevent stopping of output of the pulses of the refresh request signal RREQZ in the middle due to the switching. When the pulse width of the refresh request signal RREQZ is short, the operation control circuit 26 is not able to receive the refresh request signal RREQZ properly, and hence there is a fear that the proper refresh operation cannot be executed.

Note that, similarly to the first embodiment, the refresh address counter 28 updates the refresh address signals RRAD after the internal row address signal IRAD corresponding to the refresh request signal RREQZ is supplied to the memory core 38. Further, in this embodiment, the refresh address signals RRAD are updated after the partial set signals PSET0-1 are switched (FIG. 12(e)). Accordingly, it is possible to prevent deviation of the refresh address signals RRAD corresponding to the refresh request signals RREQ0Z, RREQZ.

As above, also in the third embodiment, the same effects as in the above-described first and second embodiments can be obtained. Further, in this embodiment, by synchronizing with the refresh request signal RREQ0Z changing of the partial refresh area PREFA which occurs asynchronously with occurrence of the refresh request signal RREQ0Z, it is possible to prevent that the refresh area PREFA is changed during a switching operation of the frequency divider 18. In other words, by switching the partial set signals PSET0-1 always after the timing of occurrence of the refresh request signal RREQ0Z, it is possible to prevent overlap of the timing of switching the partial set signals PSET0-1 and the timing of occurrence of the refresh request signal RREQZ. Consequently, it is possible to prevent that the pulse width of the refresh request signal RREQZ output from the frequency divider 18 becomes narrow, and to prevent malfunctioning of the memory MEM.

Figure 13:
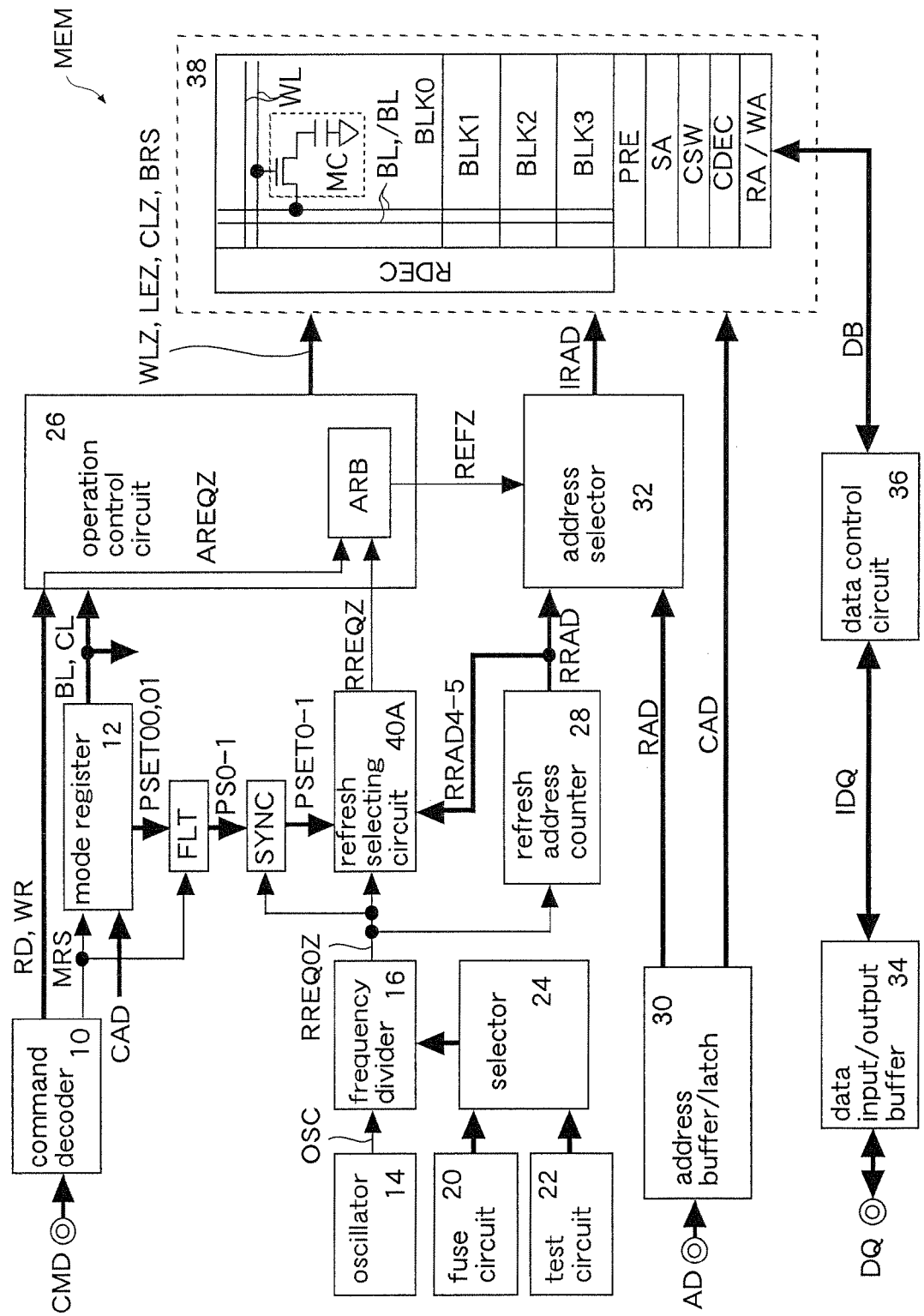
FIG. 13 illustrates a semiconductor memory of a fourth embodiment.

FIG. 13 illustrates a fourth embodiment of the present invention. The same elements as those explained in the first, second and third embodiments are given the same reference signs, and detailed explanation thereof is omitted. In this embodiment, between the filter circuit FLT and the refresh selection circuit 40A of the second embodiment, the same synchronous circuit SYNC as that of the third embodiment is formed. The other structure is the same as in the second embodiment. Specifically, the semiconductor memory MEM is, for example, an FCRAM (Fast Cycle RAM) of pseudo SRAM type. For example, the system SYS of this embodiment has the same structure as in FIG. 2. The partial refresh area PREFA is the same as in FIG. 4.

In this embodiment, by synchronizing with the refresh request signal RREQ0Z changing of the partial refresh area PREFA which occurs asynchronously with occurrence of the refresh request signal RREQ0Z, it is possible to prevent that the refresh area PREFA is changed during an operation of the refresh selection circuit 40A. In other words, by switching the partial set signals PSET0-1 always after the timing of occurrence of the refresh request signal RREQ0Z, it is possible to prevent overlap of the timing of switching the partial set signals PSET0-1 and the timing of occurrence of the refresh request signal RREQZ.

On the other hand, when the timing of switching the partial set signals PSET0-1 and the timing of occurrence of the refresh request signal RREQZ overlap, output of the refresh request signal RREQZ may stop in the middle. In this case, the pulse width of the refresh request signal RREQZ becomes short and the operation control circuit 26 cannot receive the refresh request signal RREQZ properly, and thus, there is a fear that the proper refresh operation cannot be executed. Specifically, in the refresh selection circuit 40A shown in FIG. 8, when at least one of the refresh address signals RRAD4-5 is at a high logic level, in other words, when the refresh block REFBLK is one of the memory blocks BLK1-3, change of the partial refresh area PREFA from "ALL" to "¼" may cause the pulses of the refresh request signal RREQZ to stop in the middle. More particularly, when an output of the AND circuit AND2 or AND3 shown in FIG. 8 changes to a high logic level while the refresh request signal RREQ0Z is activated due to the change from "ALL" to "¼", the refresh enable signal RENZ is inactivated. In this case, the AND circuit AND4 stops output of the refresh request signal RREQZ in the middle. As above, also in the fourth embodiment, the same effects as in the above-described first, second and third embodiments can be obtained.

Figure 14:
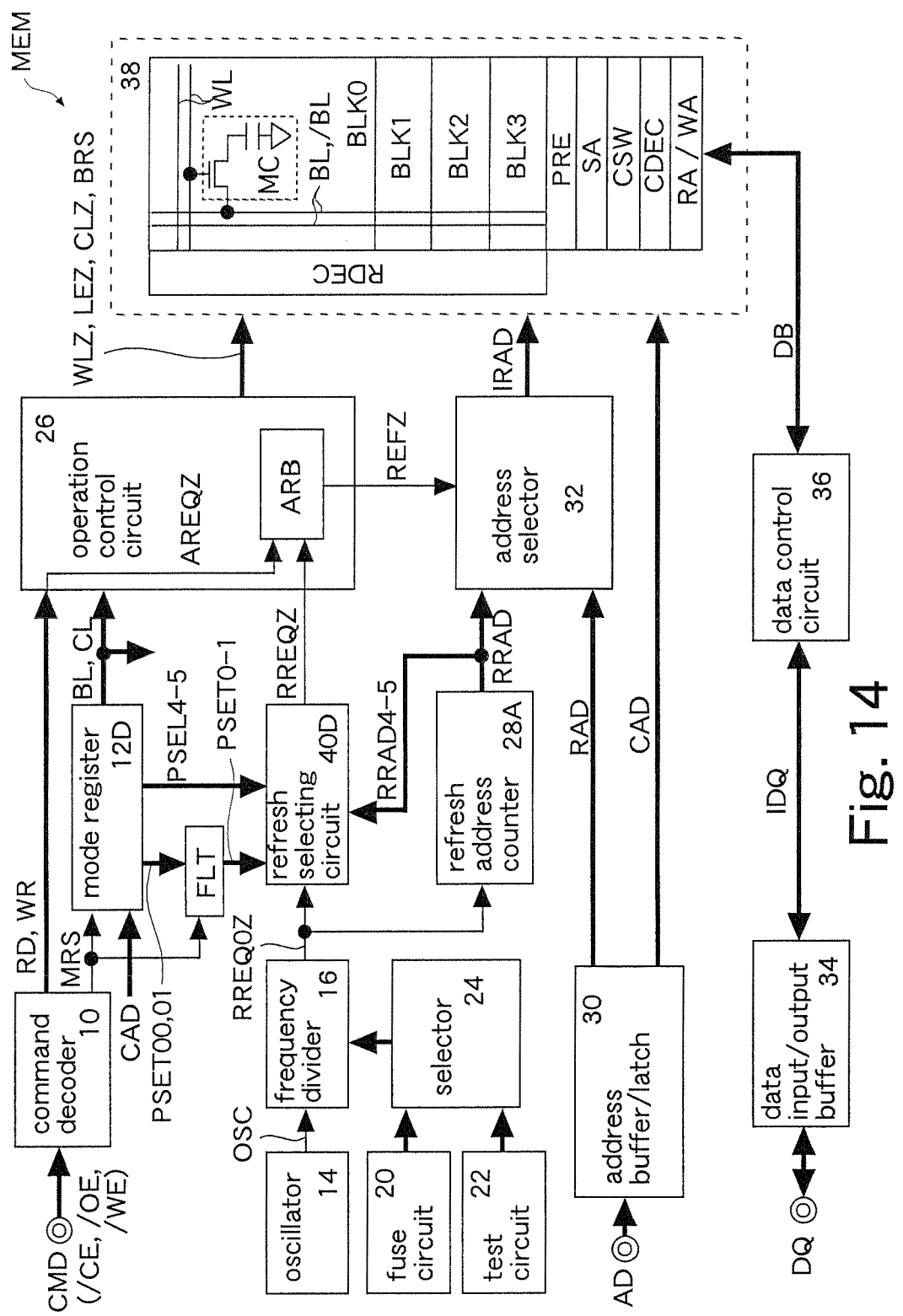
FIG. 14 illustrates a semiconductor memory of a fifth embodiment.

FIG. 14 illustrates a fifth embodiment of the present invention. The same elements as those explained in the first and second embodiments are given the same reference signs, and detailed explanation thereof is omitted. In this embodiment, instead of the mode register 12 and the refresh selection circuit 40A of the second embodiment, a mode register 12D and a refresh selection circuit 40D are formed. The other structure is the same as in the second embodiment. Specifically, the semiconductor memory MEM is, for example, an FCRAM (Fast Cycle RAM) of pseudo SRAM type. For example, the system SYS of this embodiment has the same structure as in FIG. 2. However, the partial refresh area PREFA is different from that in FIG. 4.

Together with the partial set signals PSET0-1, the mode register 12D outputs partial selection signals PSEL4-5 for replacing the partial refresh area PREFA. Accordingly, to set the logic values of the partial selection signals PSEL4-5, the mode register 12D receives the column address signal CAD which is two bit larger than in the first and second embodiments.

The refresh selection circuit 40D recognizes the partial refresh area PREFA according to the partial set signals PSET0-1 and the partial selection signals 4-5, and outputs the refresh request signal RREQZ in synchronization with only the refresh request signal RREQ0Z corresponding to the partial refresh area PREFA.

Figure 15:
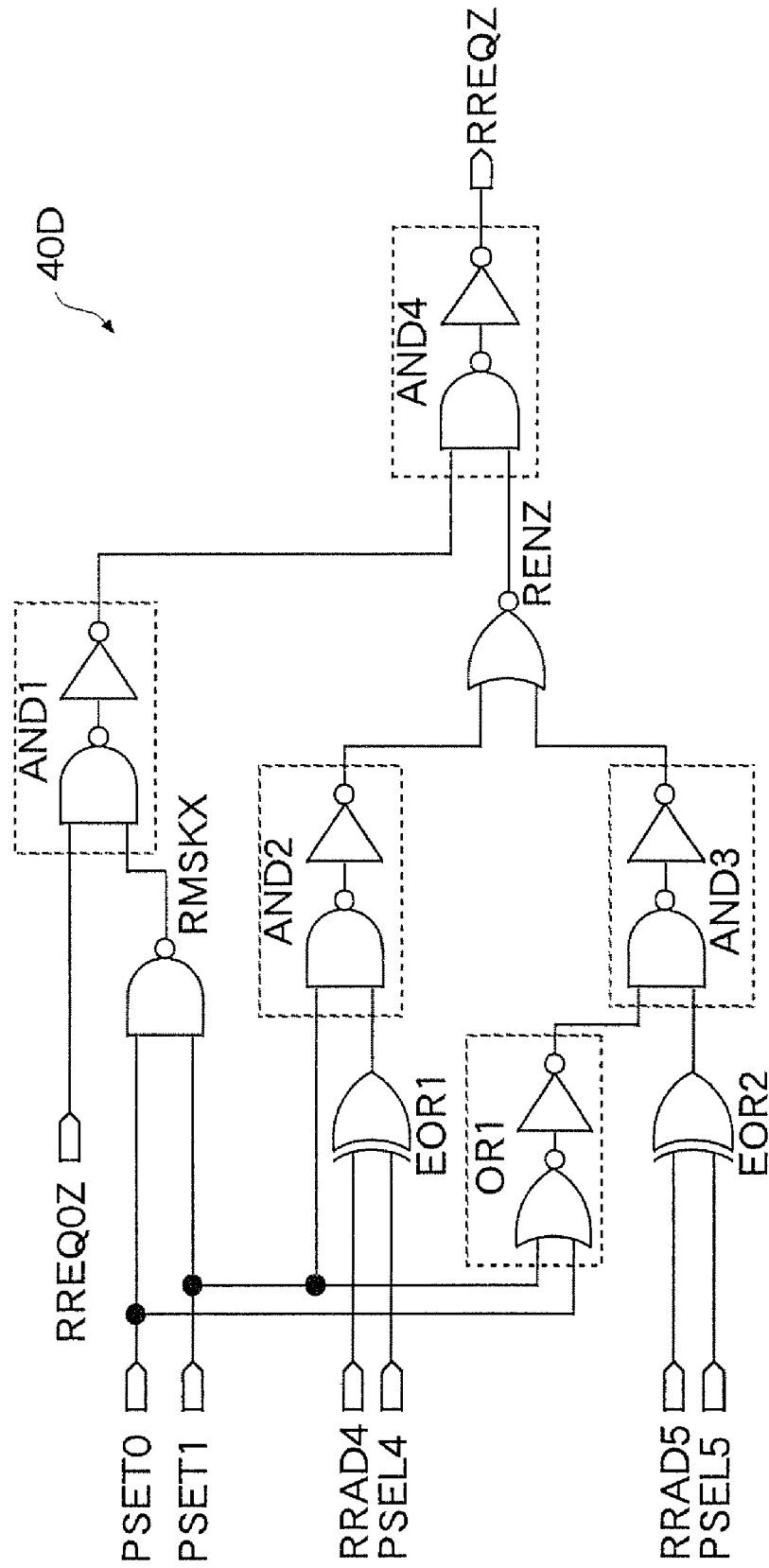
FIG. 15 illustrates details of a refresh selection circuit shown in FIG. 14.

FIG. 15 illustrates details of the refresh selection circuit 40D shown in FIG. 14. The refresh selection circuit 40D has logic gates EOR1, EOR2 coupled to inputs of the AND circuits AND2, AND3 respectively. The logic gate EOR1 calculates an exclusive OR of the row address signal RRAD4 and the partial selection signal PSEL4. The logic gate EOR2 calculates an exclusive OR of the row address signal RRAD5 and the partial selection signal PSEL5. The other structure is the same as the refresh selection circuit 40A (FIG. 8) of the second embodiment.

Figure 16:
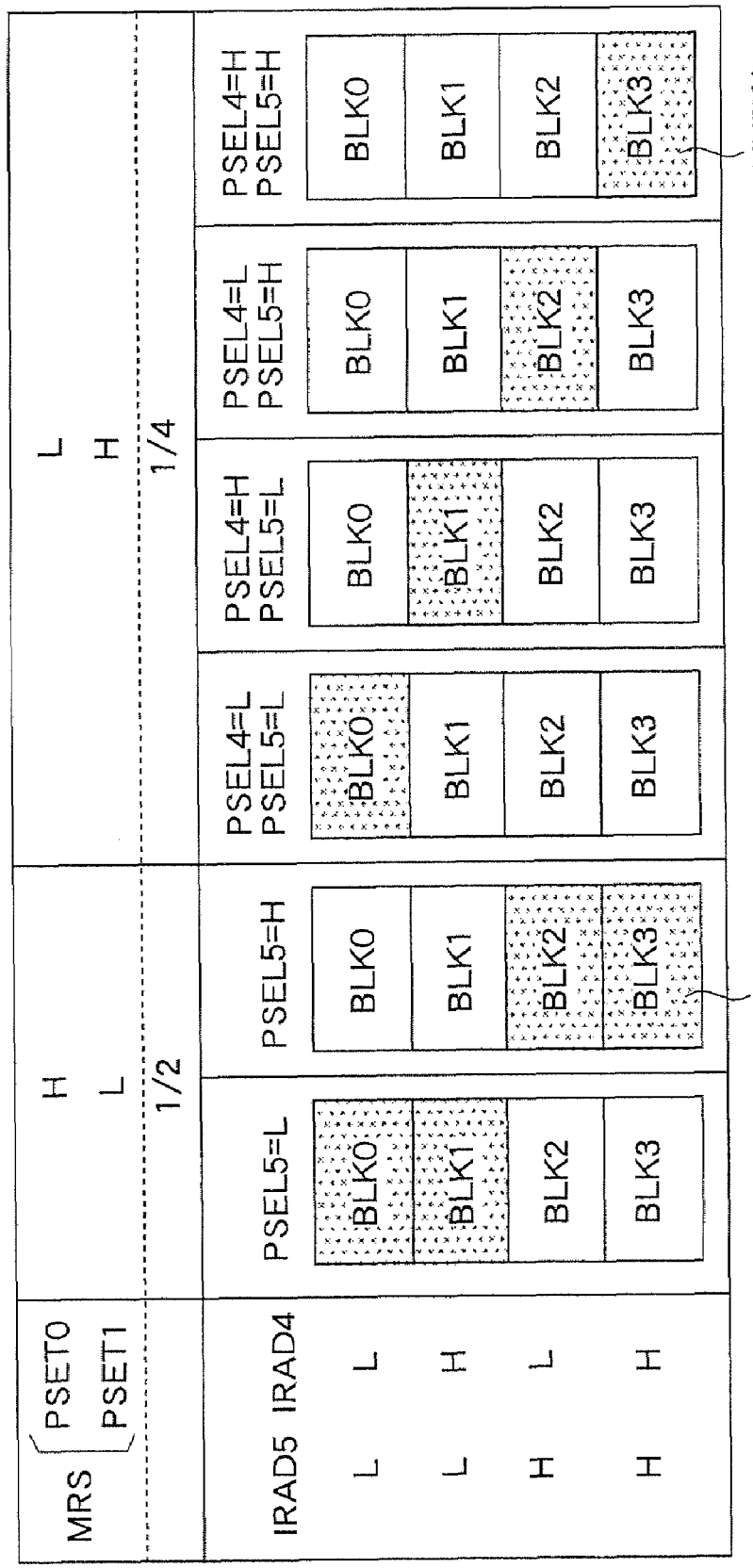
FIG. 16 illustrates a partial refresh area of the fifth embodiment.

FIG. 16 illustrates the partial refresh area PREFA of the fifth embodiment. The memory blocks BLK indicated by hatching are the partial refresh area PREFA for which the refresh operation is executed. In the memory blocks BLK indicated by blank spaces, the refresh operation is disabled.

In this embodiment, when the partial refresh area PREFA is set to "½", the partial refresh area PREFA is set to the memory blocks BLK to which the refresh address signal RRAD5 having the same logic as that of the partial selection signal PSEL5 is assigned. For example, when the partial selection signal PSEL4 is at an L level, the partial refresh area PREFA is set to the memory blocks BLK0-4.

Similarly, when the partial refresh area PREFA is set to "¼", the partial refresh area PREFA is set to the memory blocks BLK to which the refresh address signals RRAD4-5 having the same logic as that of the partial selection signals PSEL4-5 are assigned. For example, when the partial selection signals PSEL4-5 are at an H level, an L level, the partial refresh area PREFA is set to the memory block BLK1.

As above, also in the fifth embodiment, the same effects as in the above-described first and second embodiments can be obtained. Further, in this embodiment, in the memory MEM in which the partial refresh area PREFA can be replaced, it is possible to prevent masking of the necessary refresh operation, and to prevent disappearance of data retained in the memory cells MC. That is, malfunctioning of the memory MEM can be prevented.

Figure 17:
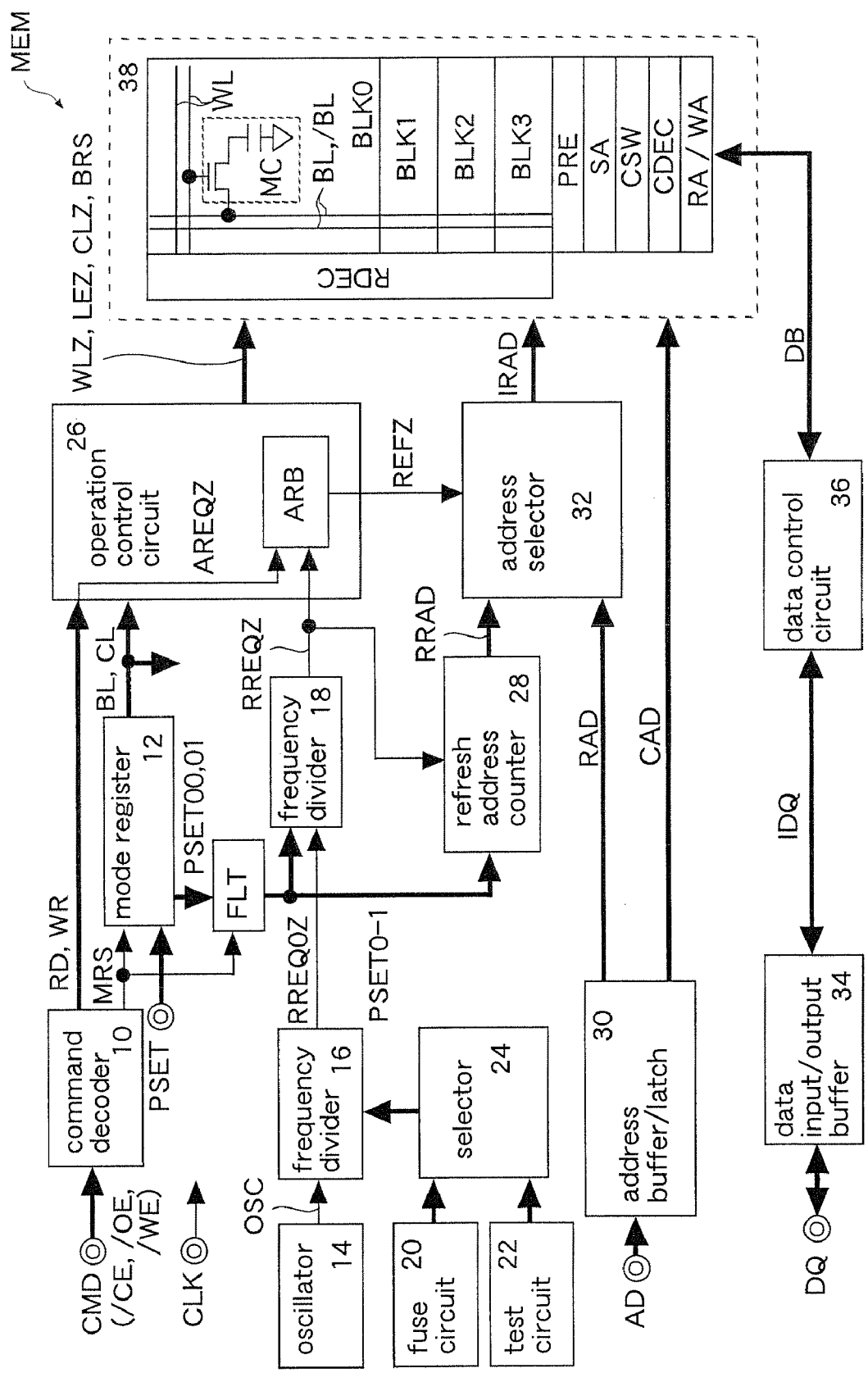
FIG. 17 illustrates a semiconductor memory of a sixth embodiment.

FIG. 17 indicates a sixth embodiment of the present invention. The same elements as those explained in the first embodiment are given the same reference signs, and detailed explanation thereof is omitted. In this embodiment, values (partial refresh area PREFA) set to the latches LT in the mode register 12 (FIG. 3) are supplied not via the address signal CAD but via a dedicated partial set terminal PSET. The other structure is the same as in the first embodiment. Specifically, the semiconductor memory MEM is, for example, an FCRAM (Fast Cycle RAM) of pseudo SRAM type. For example, the system SYS of this embodiment has the same structure as in FIG. 2, except that it has a signal line to supply a partial set signal (external input) to the partial set terminal PSET. The partial refresh area PREFA is the same as in FIG. 4. As above, also in the sixth embodiment, the same effects as in the above-described first embodiment can be obtained.

Note that in the third and the fourth embodiment, there is explained an example of operating the master-slave flip-lops MSF/F formed in the synchronous circuit SYNC in synchronization with the refresh request signal RREQ0Z. The present invention is not limited to such embodiments. For example, as shown in FIG. 18, the flip-flops MSF/F may be operated in synchronization with the oscillating signal OSC.

Figure 18:
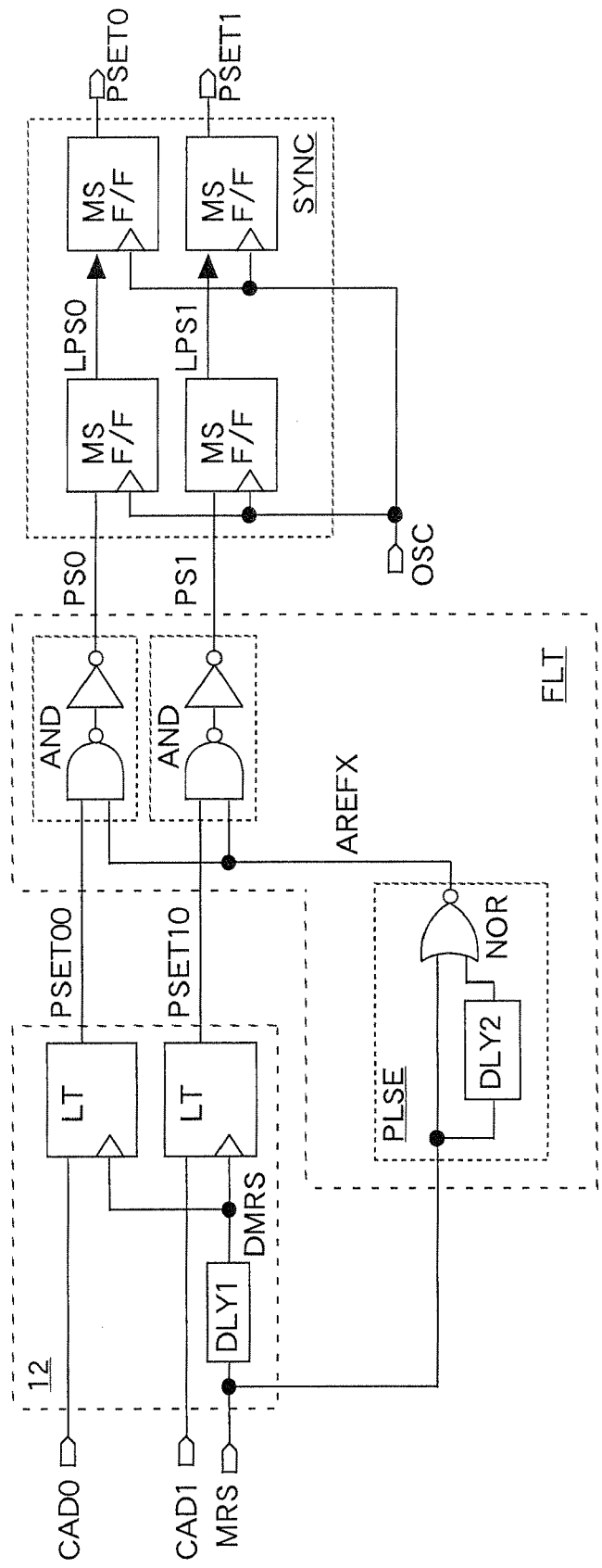
FIG. 18 illustrates another example of a mode register.
Figure 19:
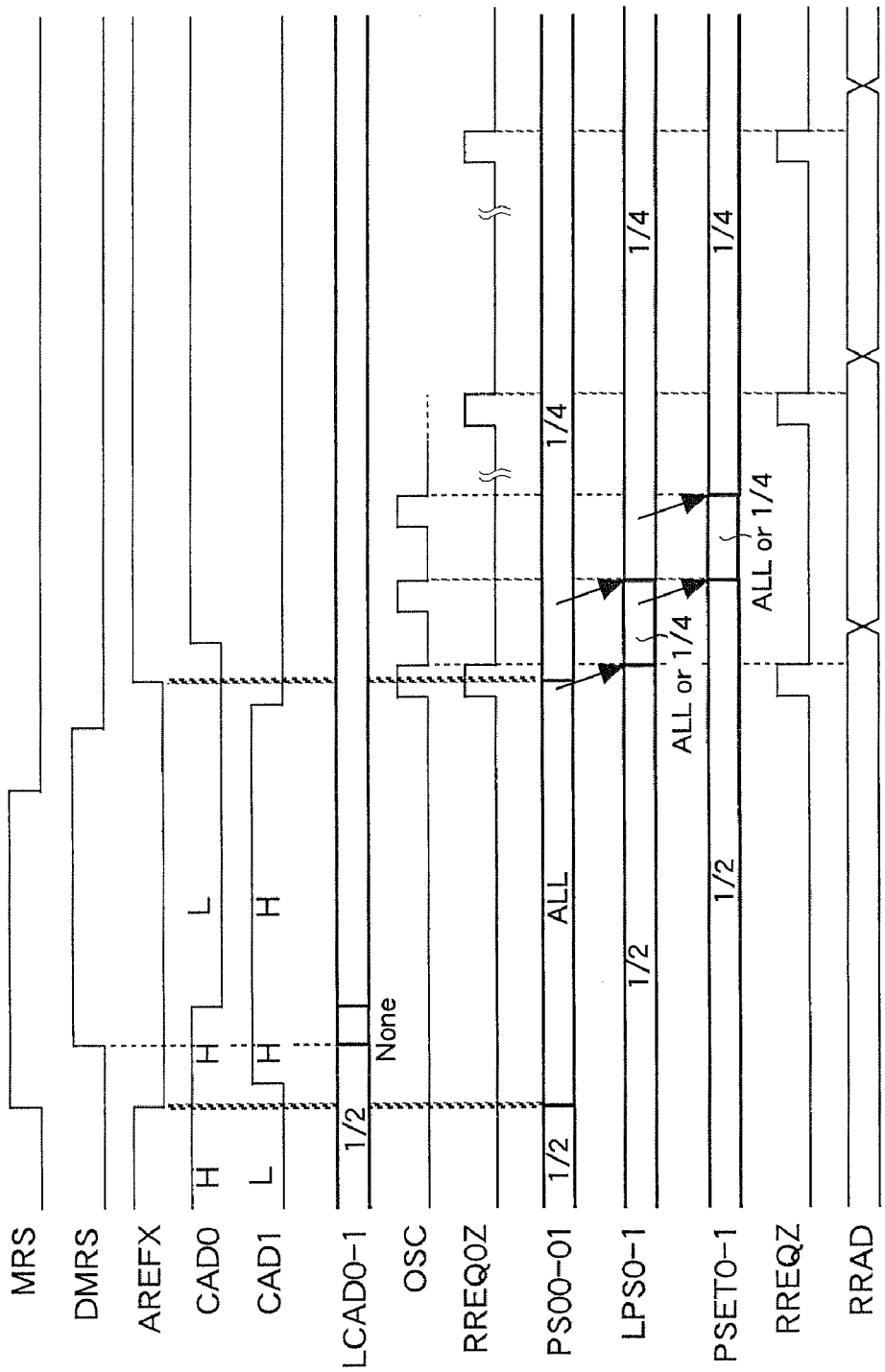
FIG. 19 illustrates operations of the mode register, a filter circuit and a synchronous circuit shown in FIG. 18.

FIG. 19 illustrates operations of the mode register 12, the filter circuit FLT, and the synchronization circuit SYNC shown in FIG. 18. The cycle of the oscillating signal OSC is 1 μs for example, which is one-tenth of the cycle (10 μs) of the refresh request signal RREQ0Z. Thus, the filter circuit FLT2 can set the partial set signals PSET0-1 to "¼" before the second refresh request signal RREQ0Z occurs.

In the above-described embodiments, an example of applying the present invention to the FCRAM of pseudo SRAM type is explained. The present invention is not limited to such embodiments. For example, the present invention may be applied to a DRAM having a self-refresh mode. In this case, the DRAM may be either of clock asynchronous type and clock synchronous type.

In the above-described embodiments, there is explained an example of forming the system SYS by mounting the system in package SiP on the system board SBRD. The present invention is not limited to such embodiments. For example, the system SYS may be formed by mounting on the system board SBRD an SoC (System on Chip) including at least the CPU, the memory controller MCNT, and the flash controller FCNT.

A proposition of the embodiments is to prevent malfunctioning of a semiconductor memory by securely executing a refresh operation even when changing of a partial refresh area and a refresh request overlap.

According to one aspect of the embodiments, a refresh set circuit sets partial refresh information indicating enabling/disabling of a refresh operation for each of the memory blocks according to an external input, and outputs the set partial refresh information as a partial set signal. A refresh request generation circuit outputs periodically a refresh request signal corresponding to a memory block for which enabling is indicated by the partial set signal. A refresh address counter generates in response to the refresh request signal a refresh address signal indicating a memory cell for which a refresh operation is executed. An operation control circuit executes a refresh operation for one of the memory blocks in response to the refresh request signal. A filter circuit masks the partial set signal from the refresh set circuit and outputs a partial set signal indicating enabling of a refresh operation for all of the memory blocks to the refresh request generation circuit during a period in which the partial refresh information is changed by the external input. Thus, during setting of the refresh set circuit, it is possible to prevent disabling of a refresh operation in response to a refresh request by partial refresh information which is not determined. In other words, even when timing of changing the partial refresh information by the refresh set circuit and timing of occurrence of the refresh request signal overlap, the refresh operation for memory blocks can be executed securely in response to the refresh request signal. Consequently, malfunctioning of the semiconductor memory can be prevented.

For example, the refresh request generation circuit has a refresh generation circuit and a frequency divider. The refresh generation circuit generates a reference refresh request signal periodically. The frequency divider divides a frequency of the reference refresh request signal according to a value of the partial set signal, and outputs divided signals as the refresh request signal. Further, the refresh address counter fixes logic of at least one bit of the refresh address signal according to the partial set signal. Alternatively, the refresh request generation circuit has a refresh generation circuit and a refresh selection circuit. The refresh selection circuit masks a part of pulses of the reference refresh request signal according to the partial set signal and the refresh address signal, and outputs rest of the pulses which are not masked as the refresh request signal. Accordingly, in response to the refresh request signal, a refresh operation for only the memory block corresponding to the partial set signal can be executed sequentially.

For example, the synchronous circuit synchronizes the partial set signal from the filter circuit with the reference refresh request signal and outputs the synchronized signal to the refresh request generation circuit. Accordingly, the partial set signal can be switched always after the timing of occurrence of the reference refresh request signal. In other words, it is possible to prevent overlap of the timing of switching the partial set signal and the timing of occurrence of the refresh request signal. For example, it is possible to prevent masking of pulses of the refresh request signal while being output by switching of the partial set signal. Consequently, the refresh operation can be executed securely, and malfunctioning of the semiconductor memory can be prevented.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
   a plurality of memory blocks each having dynamic memory cells;
   a refresh set circuit which sets partial refresh information indicating enabling/disabling of a refresh operation for each of the memory blocks according to an external input, and outputs the set partial refresh information as a partial set signal;
   a refresh request generation circuit which outputs periodically a refresh request signal corresponding to the memory block for which enabling is indicated by the partial set signal;
   a refresh address counter which generates in response to the refresh request signal a refresh address signal indicating the memory cell for which the refresh operation is executed;
   an operation control circuit which executes the refresh operation for one of the memory blocks in response to the refresh request signal; and
   a filter circuit which masks the partial set signal from the refresh set circuit and outputs the partial set signal indicating enabling of the refresh operation for all of the memory blocks to the refresh request generation circuit during a period in which the partial refresh information is changed by the external input.

2. The semiconductor memory according to claim 1, wherein:
   the refresh request generation circuit comprises
   a refresh generation circuit which generates a reference refresh request signal periodically, and
   a frequency divider which divides a frequency of the reference refresh request signal according to a value of the partial set signal, and outputs divided signals as the refresh request signal; and
   the refresh address counter fixes logic of at least one bit of the refresh address signal according to the partial set signal.

3. The semiconductor memory according to claim 1, wherein
   the refresh request generation circuit comprises:
   a refresh generation circuit which generates a reference refresh request signal periodically; and
   a refresh selection circuit which masks a part of pulses of the reference refresh request signal according to the partial set signal and the refresh address signal, and outputs rest of the pulses which are not masked as the refresh request signal.

4. The semiconductor memory according to claim 1, further comprising
   a synchronous circuit which synchronizes the partial set signal from the filter circuit with the reference refresh request signal and outputs the synchronized signal to the refresh request generation circuit.

5. The semiconductor memory according to claim 4, wherein
   the synchronous circuit comprises a pair of flip-flops coupled in series to latch the partial set signal sequentially in synchronization with the reference refresh request signal.

6. The semiconductor memory according to claim 4, wherein
   the synchronous circuit outputs the partial set signal before the refresh address counter switches the refresh address signal in response to the refresh request signal.

7. The semiconductor memory according to claim 1, further comprising
   a mode register in which an operating specification of the semiconductor memory is set according to an external input, wherein
   the refresh set circuit is formed in the mode register.

8. The semiconductor memory according to claim 1, further comprising
   a dedicated terminal which receives the partial refresh information as the external input.

9. A system comprising a semiconductor memory and a controller which outputs an access request to the semiconductor memory, wherein:

the semiconductor memory comprising:
a plurality of memory blocks each having dynamic memory cells,
a refresh set circuit which sets partial refresh information indicating enabling/disabling of a refresh operation for each of the memory blocks according to an external input, and outputs the set partial refresh information as a partial set signal,
a refresh request generation circuit which outputs periodically a refresh request signal corresponding to the memory block for which enabling is indicated by the partial set signal,
a refresh address counter which generates in response to the refresh request signal a refresh address signal indicating the memory cell for which the refresh operation is executed;
an operation control circuit which executes the refresh operation for one of the memory blocks in response to the refresh request signal, and
a filter circuit which masks the partial set signal from the refresh set circuit and outputs the partial set signal indicating enabling of the refresh operation for all of the memory blocks to the refresh request generation circuit during a period in which the partial refresh information is changed by the external input; and
the controller sets the partial refresh information to the semiconductor memory.

10. The system according to claim 9, wherein:
the refresh request generation circuit comprises
a refresh generation circuit which generates a reference refresh request signal periodically, and
a frequency divider which divides a frequency of the reference refresh request signal according to a value of the partial set signal, and outputs divided signals as the refresh request signal; and
the refresh address counter fixes logic of at least one bit of the refresh address signal according to the partial set signal.

11. The system according to claim 9, wherein
the refresh request generation circuit comprises:
a refresh generation circuit which generates a reference refresh request signal periodically; and
a refresh selection circuit which masks a part of pulses of the reference refresh request signal according to the partial set signal and the refresh address signal, and outputs rest of the pulses which are not masked as the refresh request signal.

12. The system according to claim 9, wherein
the semiconductor memory further comprises
a synchronous circuit which synchronizes the partial set signal from the filter circuit with the reference refresh request signal and outputs the synchronized signal to the refresh request generation circuit.

13. The system according to claim 12, wherein
the synchronous circuit comprises a pair of flip-flops coupled in series to latch the partial set signal sequentially in synchronization with the reference refresh request signal.

14. The system according to claim 12, wherein
the synchronous circuit outputs the partial set signal before the refresh address counter switches the refresh address signal in response to the refresh request signal.

15. The system according to claim 9, wherein
the semiconductor memory further comprises a mode register in which an operating specification of the semiconductor memory is set according to an external input, wherein the refresh set circuit is formed in the mode register.

16. The system according to claim 9, wherein
the semiconductor memory further comprises a dedicated terminal which receives the partial refresh information as the external input.

17. An operating method of a semiconductor memory including a plurality of memory blocks each having dynamic memory cells and operating in response to an access request signal from an outside and a refresh request signal generated inside, the method comprising:
setting partial refresh information indicating enabling/disabling of a refresh operation for each of the memory blocks according to an external input, and outputting the set partial refresh information as a partial set signal;
outputting periodically a refresh request signal corresponding to the memory block for which enabling is indicated by the partial set signal;
generating in response to the refresh request signal a refresh address signal indicating the memory cell for which the refresh operation is executed;
executing the refresh operation for one of the memory blocks in response to the refresh request signal; and
masking the partial set signal so as to enable the refresh operation for all of the memory blocks during a period in which the partial refresh information is changed by the external input.

18. The operating method of the semiconductor memory according to claim 17, further comprising:
generating a reference refresh request signal periodically;
dividing a frequency of the reference refresh request signal according to a value of the partial set signal, and outputting divided signals as the refresh request signal; and
fixing logic of at least one bit of the refresh address signal according to the partial set signal.

19. The operating method of the semiconductor memory according to claim 17, further comprising:
generating a reference refresh request signal periodically;
masking a part of pulses of the reference refresh request signal according to the partial set signal and the refresh address signal; and
outputting rest of the pulses which are not masked as the refresh request signal.

20. The operating method of the semiconductor memory according to claim 17, further comprising synchronizing the partial set signal with the reference refresh request signal.

21. The operating method of the semiconductor memory according to claim 20, further comprising latching the partial set signal sequentially in synchronization with the reference refresh request signal.

22. The operating method of the semiconductor memory according to claim 20, further comprising outputting the partial set signal before switching the refresh address signal in response to the refresh request signal.

23. The operating method of the semiconductor memory according to claim 17, further comprising setting the partial refresh information to a mode register in which an operating specification of the semiconductor memory is set.

24. The operating method of the semiconductor memory according to claim 17, further comprising receiving by a dedicated terminal the partial refresh information as the external input.

* * * * *